(12) United States Patent
Boles et al.

(10) Patent No.: US 10,622,467 B2
(45) Date of Patent: Apr. 14, 2020

(54) HIGH-VOLTAGE GAN HIGH ELECTRON MOBILITY TRANSISTORS WITH REDUCED LEAKAGE CURRENT

(71) Applicant: MACOM Technology Solutions Holdings, Inc., Lowell, MA (US)

(72) Inventors: Timothy E. Boles, Tyngsboro, MA (US); Douglas Carlson, Lowell, MA (US); Anthony Kaleta, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 16/199,408

(22) Filed: Nov. 26, 2018

(65) Prior Publication Data
US 2019/0341480 A1    Nov. 7, 2019

Related U.S. Application Data

(63) Continuation of application No. 15/223,734, filed on Jul. 29, 2016, now abandoned.
(Continued)

(51) Int. Cl.
| | |
|---|---|
| *H01L 29/778* | (2006.01) |
| *H01L 29/40* | (2006.01) |
| *H01L 29/423* | (2006.01) |
| *H01L 29/205* | (2006.01) |
| *H01L 29/66* | (2006.01) |
| *H01L 29/06* | (2006.01) |

(Continued)

(52) U.S. Cl.
CPC ...... *H01L 29/7786* (2013.01); *H01L 29/0653* (2013.01); *H01L 29/205* (2013.01); *H01L 29/401* (2013.01); *H01L 29/404* (2013.01); *H01L 29/42312* (2013.01); *H01L 29/42376* (2013.01); *H01L 29/475* (2013.01); *H01L 29/517* (2013.01); *H01L 29/66462* (2013.01); *H01L 29/7787* (2013.01); *H01L 29/2003* (2013.01); *H01L 29/402* (2013.01); *H01L 29/41758* (2013.01); *H01L 29/41766* (2013.01); *H01L 29/42316* (2013.01)

(58) Field of Classification Search
CPC ............ H01L 29/7786; H01L 29/401; H01L 29/66462; H01L 29/42312; H01L 29/402; H01L 29/2003; H01L 29/0653
See application file for complete search history.

(56) References Cited

U.S. PATENT DOCUMENTS

| | | | |
|---|---|---|---|
| 4,692,998 A | 9/1987 | Armstrong et al. | |
| 4,737,236 A | 4/1988 | Perko et al. | |

(Continued)

OTHER PUBLICATIONS

U.S. Appl. No. 15/223,455, Kaleta et al., filed Jul. 29, 2016.
(Continued)

*Primary Examiner* — Victor A Mandala
(74) *Attorney, Agent, or Firm* — Wolf, Greenfield & Sacks, P.C.

(57) ABSTRACT

High-voltage, gallium-nitride HEMTs are described that are capable of withstanding reverse-bias voltages of at least 900 V and, in some cases, in excess of 2000 V with low reverse-bias leakage current. A HEMT may comprise a lateral geometry having a gate, a thin insulating layer formed beneath the gate, a gate-connected field plate, and a source-connected field plate.

26 Claims, 16 Drawing Sheets

Related U.S. Application Data

(60) Provisional application No. 62/323,569, filed on Apr. 15, 2016, provisional application No. 62/323,568, filed on Apr. 15, 2016.

(51) Int. Cl.
*H01L 29/47* (2006.01)
*H01L 29/51* (2006.01)
H01L 29/417 (2006.01)
H01L 29/20 (2006.01)

(56) References Cited

U.S. PATENT DOCUMENTS

| | | | |
|---|---|---|---|
| 5,268,310 | A | 12/1993 | Goodrich et al. |
| 5,343,070 | A | 8/1994 | Goodrich et al. |
| 5,696,466 | A | 12/1997 | Li |
| 5,877,530 | A | 3/1999 | Aronowitz et al. |
| 5,976,941 | A | 11/1999 | Boles et al. |
| 6,014,064 | A | 1/2000 | Boles et al. |
| 6,114,716 | A | 9/2000 | Boles et al. |
| 6,150,197 | A | 11/2000 | Boles et al. |
| 6,197,645 | B1 | 3/2001 | Michael et al. |
| 6,329,702 | B1 | 12/2001 | Gresham et al. |
| 6,379,785 | B1 | 4/2002 | Ressler et al. |
| 6,465,289 | B1 | 10/2002 | Streit et al. |
| 6,600,199 | B2 | 7/2003 | Voldman et al. |
| 7,026,223 | B2 | 4/2006 | Goodrich et al. |
| 7,071,498 | B2 | 7/2006 | Johnson et al. |
| 7,223,441 | B2 | 5/2007 | Remington et al. |
| 7,402,842 | B2 | 7/2008 | Goodrich |
| 7,419,892 | B2 | 9/2008 | Sheppard et al. |
| 7,692,263 | B2 | 4/2010 | Wu et al. |
| 7,709,859 | B2 | 5/2010 | Smith et al. |
| 7,719,091 | B2 | 5/2010 | Brogle |
| 7,745,848 | B1 | 6/2010 | Rajagopal et al. |
| 7,755,173 | B2 | 7/2010 | Mondi et al. |
| 7,858,456 | B2 | 12/2010 | Chiola et al. |
| 7,868,428 | B2 | 1/2011 | Goodrich et al. |
| 8,237,198 | B2 | 8/2012 | Wu et al. |
| 8,912,610 | B2 | 12/2014 | Lin et al. |
| 8,946,724 | B1 | 2/2015 | Shinohara et al. |
| 9,142,659 | B2 | 9/2015 | Dora et al. |
| 9,281,417 | B1 | 3/2016 | Lin |
| 9,799,760 | B2 * | 10/2017 | Green .................. H01L 29/402 |
| 9,818,856 | B2 | 11/2017 | Hoshi et al. |
| 9,837,521 | B2 * | 12/2017 | Yamamoto ........ H01L 29/42316 |
| 9,837,524 | B2 * | 12/2017 | Miyake .............. H01L 29/7783 |
| 9,853,108 | B2 * | 12/2017 | Kawaguchi .......... H01L 29/402 |
| 9,893,174 | B2 * | 2/2018 | Chowdhury ........ H01L 29/4236 |
| 9,911,817 | B2 * | 3/2018 | Xia ...................... H01L 29/404 |
| 9,935,190 | B2 * | 4/2018 | Wu ..................... H01L 29/7786 |
| 2002/0139971 | A1 | 10/2002 | Eda |
| 2003/0141518 | A1 | 7/2003 | Yokogawa et al. |
| 2005/0145851 | A1 | 7/2005 | Johnson et al. |
| 2007/0018199 | A1 | 1/2007 | Sheppard et al. |
| 2007/0126067 | A1 | 6/2007 | Hattendorf et al. |
| 2008/0265379 | A1 | 10/2008 | Brandes et al. |
| 2008/0308813 | A1 | 12/2008 | Suh et al. |
| 2009/0026498 | A1 | 1/2009 | Matsuda |
| 2009/0267078 | A1 | 10/2009 | Mishra et al. |
| 2010/0019279 | A1 | 1/2010 | Chen et al. |
| 2010/0117146 | A1 * | 5/2010 | Ikeda ................ H01L 29/66462 257/330 |
| 2011/0049526 | A1 * | 3/2011 | Chu .................. H01L 21/28587 257/76 |
| 2012/0223320 | A1 | 9/2012 | Dora et al. |
| 2013/0043517 | A1 | 2/2013 | Yin et al. |
| 2014/0103357 | A1 | 4/2014 | Decoutere et al. |
| 2014/0159116 | A1 | 6/2014 | Briere et al. |
| 2014/0231823 | A1 | 8/2014 | Chowdhury et al. |
| 2014/0306235 | A1 | 10/2014 | Decoutere et al. |
| 2015/0294984 | A1 | 10/2015 | Cheng et al. |
| 2015/0303291 | A1 | 10/2015 | Makiyama et al. |
| 2016/0086938 | A1 | 3/2016 | Kinzer |
| 2016/0155674 | A1 | 6/2016 | Cho et al. |
| 2016/0190298 | A1 | 6/2016 | Wu et al. |
| 2016/0233235 | A1 | 8/2016 | Miyairi et al. |
| 2017/0133500 | A1 | 5/2017 | Etou et al. |
| 2017/0301780 | A1 | 10/2017 | Boles et al. |
| 2017/0301781 | A1 | 10/2017 | Boles et al. |
| 2017/0301798 | A1 | 10/2017 | Kaleta et al. |
| 2017/0301799 | A1 | 10/2017 | Boles et al. |
| 2017/0317202 | A1 * | 11/2017 | Green ................. H01L 23/3171 |
| 2017/0338171 | A1 | 11/2017 | Cho et al. |
| 2017/0345812 | A1 | 11/2017 | Chou et al. |
| 2018/0175268 | A1 | 6/2018 | Moon et al. |
| 2018/0248009 | A1 | 8/2018 | Wong et al. |
| 2018/0295683 | A1 | 10/2018 | Tung et al. |
| 2019/0229114 | A1 | 7/2019 | Boles et al. |
| 2019/0229115 | A1 | 7/2019 | Boles et al. |

OTHER PUBLICATIONS

U.S. Appl. No. 15/223,614, Boles et al., filed Jul. 29, 2016.
U.S. Appl. No. 15/223,677, Boles et al., filed Jul. 29, 2016.
U.S. Appl. No. 15/875,406, Boles et al., filed Jan. 19, 2018.
U.S. Appl. No. 15/875,411, Boles et al., filed Jan. 19, 2018.
U.S. Appl. No. 16/431,480, Boles et al., filed Jun. 4, 2019.
Invitation to Pay Additional Fees for Application No. PCT/US2017/027779 dated Oct. 5, 2017.
International Search Report and Written Opinion for Application No. PCT/US20171027779 dated Nov. 29, 2017.
Written Opinion of the IPEA for Application No. PCT/US2017/027779 dated May 8, 2018.
Ch. II International Preliminary Report on Patentability for International Application No. PCT/US2017/027779, dated Aug. 9, 2018.
Invitation to Pay Additional Fees for Applicadon No. PCT/US2017/027780 dated Sep. 25, 2017.
International Search Report and Written Opinion for Application No. PCT/US2017/027780, dated Dec. 21, 2017.
Written Opinion of the IPEA for Application No. PCT/US2017/027780 dated May 30, 2018.
Ch. II International Preliminary Report on Patentability for International Application No. PCT/US2017/027780, dated Jul. 24, 2018.
Tsou et al., 2.07-kV AlGaN/GaN Schottky Barrier Diodes on Silicon With High Baliga's Figure-of-Merit. IEEE Electron Device Letters. Jan. 2016;37(1):70-3.
Tangsheng et al., AlGaN/GaN MIS HEMT with AlN Dielectric. GaAs Mantech Conf Proc. 2006: 227-230.

* cited by examiner

HIGH-VOLTAGE GAN HIGH ELECTRON MOBILITY TRANSISTORS WITH REDUCED LEAKAGE CURRENT

CROSS REFERENCE TO RELATED APPLICATIONS

This application is a Continuation of U.S. application Ser. No. 15/223,734, filed Jul. 29, 2016, titled "HIGH-VOLTAGE GAN HIGH ELECTRON MOBILITY TRANSISTORS WITH REDUCED LEAKAGE CURRENT", which claims priority to U.S. provisional application No. 62/323,568, filed Apr. 15, 2016, titled "High-Voltage GaN High Electron Mobility Transistors" and to U.S. provisional application No. 62/323,569, filed Apr. 15, 2016, titled "High-Voltage Lateral GaN-on-Silicon Schottky Diode with Reduced Junction Leakage." Each of the foregoing applications is hereby incorporated by reference in its entirety.

BACKGROUND

Technical Field

The technology relates to high-voltage high-electron mobility transistors formed from gallium-nitride materials.

Discussion of the Related Art

Gallium-nitride semiconductor material has received appreciable attention in recent years because of its desirable electronic and electro-optical properties. Gallium nitride (GaN) has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, gallium nitride is more resistant to avalanche breakdown and has a higher intrinsic field strength compared to more common semiconductor materials, such as silicon and gallium arsenide. In addition, gallium nitride is a wide bandgap semiconductor and is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, and high-power applications. For example, gallium-nitride materials are useful for active circuit components in semiconductor amplifiers for radio-frequency (RF) communications, radar, and microwave applications.

High-electron mobility transistors (HEMTs) are a type of semiconductor transistor that utilizes a two-dimensional electron gas (2DEG) for carrier transport. The 2DEG is formed at a heterojunction between two different semiconductor materials having different band gaps. The heterojunction results in the formation of a high-density electron layer in an undoped semiconductor. Because of the lack of dopants (which act as impurities) the free electrons can travel through the undoped semiconductor with greatly reduced scattering. Accordingly, HEMTs can be operated at very high frequencies, e.g., well into the terahertz frequency range.

SUMMARY

Structures and methods for forming high-voltage HEMTs with gallium-nitride material are described. In some implementations, the HEMTs may be formed from one or more layers of gallium-nitride material deposited on a substrate of a different material (e.g., silicon or silicon carbide). The HEMTs may be arranged in a lateral, source-gate-drain configuration, and, in some implementations, may be capable of withstanding reverse-bias voltages of more than 2000 volts and having low reverse-bias leakage currents (e.g., on the order of 40 $\mu$A/mm of gate width). The high-voltage HEMTs may be useful for high-frequency power electronics and microwave applications including radar, and RF communications applications among other applications.

Some embodiments relate to a high electron-mobility transistor (HEMT) comprising a gallium-nitride conduction layer, a barrier layer formed over the gallium-nitride conduction layer, and a gate, source, and drain formed over the barrier layer. The HEMT may further include a first insulating layer formed in regions between the gate and drain and between the gate and source, a gallium-oxide layer formed between the barrier layer and the gate, and a gate-connected field plate electrically connected to the gate and extending beyond edges of the gate toward the drain and source over the first insulating layer.

In some aspects, the gallium-oxide layer has a thickness between approximately 1 nm and approximately 5 nm. In some aspects, a HEMT further comprises a gallium-nitride cap layer formed between the barrier layer and the gallium-oxide layer. A thickness of the gallium-nitride cap layer may be between approximately 1 nm and approximately 10 nm.

In some implementations, a HEMT may further comprise a source-connected field plate comprising a conductor that is electrically connected to the source and extends over the gate, and a second insulating layer separating the source-connected field plate and the gate. In some aspects, the source-connected field plate extends beyond the gate-connected field plate toward the drain a distance between approximately 1 micron and approximately 4 microns. An edge of the source-connected field plate may be between approximately 4 microns and approximately 10 microns from an edge of the drain. A thickness of the first insulating layer may be between approximately 25 nm and approximately 200 nm. A thickness of the second insulating layer may be between approximately 300 nm and approximately 600 nm. According to some aspects, a HEMT according to a foregoing embodiment may be configured to withstand a reverse-bias voltage of approximately 2000 volts. Further, a HEMT may exhibit a reverse-leakage current at 2000 volts reverse bias of not more than 40 microamps per millimeter of gate width. In some aspects, a HEMT is configured to handle a forward current of 1 amp per millimeter of gate width.

According to some aspects, a HEMT may further comprise electrical isolation regions formed adjacent to the source and drain, wherein the electrical isolation regions comprise damaged crystalline semiconductor that includes one or more of the following implanted ion species: nitrogen, phosphorous, boron, and argon.

In some implementations, a length of the gate in a HEMT is between approximately 0.1 micron and approximately 1.5 micron. In some aspects, edges of the gate are sloped outward between approximately 5 degrees and approximately 60 degrees from vertical. According to some implementations, the gate-connected field plate extends beyond a first edge of the gate toward the drain between approximately 0.3 μm and approximately 0.8 μm, and extends beyond a second edge of the gate toward the source between approximately 0.1 μm and approximately 0.4 μm. In some aspects, a spacing between an edge of the gate and an edge of the drain is between approximately 5 microns and approximately 20 microns. In some cases, the gate length is approximately 0.15 micron, and the HEMT is configured to drive currents up to 1 amp/mm at modulation rates as high as 30 GHz.

Some embodiments relate to a high electron-mobility transistor (HEMT) comprising a gallium-nitride conduction layer, a barrier layer formed over the gallium-nitride conduction layer, and a gate, source, and drain formed over the barrier layer. A HEMT may further include a first insulating layer formed in regions between the gate and drain and between the gate and source, a gate insulating layer having a thickness between approximately 1 nm and approximately 5 nm formed between the barrier layer and the gate, and a gate-connected field plate electrically connected to the gate and extending beyond edges of the gate toward the drain and source over the first insulating layer.

In some aspects, a HEMT may further comprise a source-connected field plate comprising a conductor that is electrically connected to the source and extends over the gate, and a second insulating layer separating the source-connected field plate and the gate. The source-connected field plate may extend beyond the gate-connected field plate toward the drain a distance between approximately 1 micron and approximately 4 microns. In some cases, an edge of the source-connected field plate is between approximately 4 microns and approximately 10 microns from an edge of the drain. In some aspects, a thickness of the first insulating layer is between approximately 25 nm and approximately 200 nm. In some cases, a thickness of the second insulating layer is between approximately 300 nm and approximately 600 nm. A HEMT according to a foregoing embodiment may be configured to withstand a reverse-bias voltage of approximately 2000 volts. In some aspects, a reverse-leakage current at 2000 volts reverse bias is not more than 40 microamps per millimeter of gate width. According to some implementations, A HEMT is configured to handle a forward current of 1 amp per millimeter of gate width. In some aspects, the gate insulating layer comprises gallium-oxide.

Some embodiments relate to methods for making a high electron-mobility transistor (HEMT). A method may comprise acts of forming a gallium-nitride conduction layer on a substrate, forming a barrier layer adjacent to the gallium-nitride conduction layer, forming a first source and a drain spaced apart and in electrical contact with the conduction layer, forming a gate adjacent to the barrier layer between the source and the drain, and forming a gallium-oxide layer between the gate and the barrier layer.

In some implementations, the act of forming the gallium-oxide layer comprises opening a via to expose a region of a gallium-nitride layer at the location of the gate prior to forming the gate, and subjecting the exposed region to an oxygen plasma for a period of time. The period of time may be between approximately 10 seconds and approximately 120 seconds. A method for making a HEMT may further comprise maintaining a pressure between approximately 0.5 Torr and approximately 3 Torr while subjecting the exposed region to the oxygen plasma.

According to some aspects, a method for making a HEMT may further comprise forming a gallium-nitride cap layer between the barrier layer and the source and drain, wherein the gallium-oxide layer is formed from the gallium-nitride cap layer. In some implementations, a method may further comprise acts of forming a first insulating layer that extends between the source and gate and the gate and drain, and forming a gate-connected field plate in electrical contact with the gate that extends beyond outer edges of the gate toward the source and drain. According to some aspects, a method for making a HEMT may further comprise forming a second insulating layer that extends over the gate and gate-connected field plate, and forming a source-connected field plate in electrical contact with the source that extends beyond the gate toward the drain. A method for making a HEMT may further comprise implanting ions into the conduction layer to damage the conduction layer and form electrical isolation regions adjacent to the source and the drain.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Microwave and radio frequency (RF) systems often include circuitry arranged to translate a frequency of a signal to a higher or lower frequency value. Frequency translation can occur in applications involving wireless transmission and receiving of signals. For example, a signal that is modulated at a first rate to encode data may be mixed onto a high-frequency carrier wave to transmit the data, and may later be down-converted at a receiver to decode the data. Some applications may involve amplification of an RF or microwave signal at frequencies over several hundred megahertz and well into the gigahertz regime, e.g., for wireless communications and radar applications. Because of their high speed, high-electron-mobility transistors (HEMTs) are useful for such applications. Because large currents and voltages can be present in these applications, it is desirable for a HEMT to withstand high reverse-bias potentials. It is also desirable for a HEMT to have low leakage currents, which can degrade device performance and efficiency.

A HEMT may be characterized by several figures of merit. One figure of merit may be an amount of current the device can handle and its on-state resistance when forward biased. Another figure of merit may be an amount of reverse-bias current leaked through the transistor when the HEMT is reverse biased. Another figure of merit may be a reverse-bias breakdown voltage of the transistor. A breakdown voltage may be a maximum amount of reverse-bias voltage that the transistor can withstand between its source and drain before avalanche breakdown and high current conduction occur that can damage the HEMT. Another figure of merit is a high speed or high frequency at which the device may operate.

The inventors have recognized and appreciated that applications relating to RF and microwave communication systems, radar, and RF power switching may benefit from HEMTs having very high breakdown voltages and low leakage currents. The inventors have conceived and developed structures and methods for forming HEMTs with reverse-breakdown voltages that can exceed 2000 volts, reverse-bias leakage currents on the order of 40 microamps/mm of gate width and forward current handling capability of over 1 amp/mm. Such transistors have higher breakdown voltages than currently available GaN HEMT devices. These transistors can be used at frequencies above 100 MHz and at frequencies up to 30 GHz or higher, and resist high-voltage transients that might otherwise damage the device.

Figure 1A:
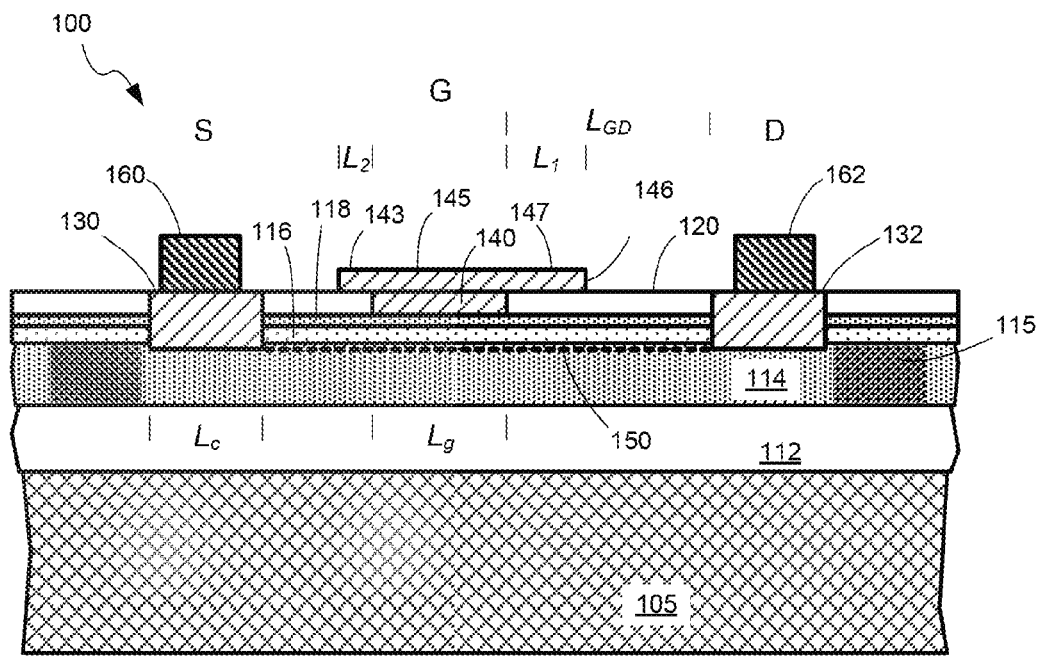
FIG. 1A is an elevation view depicting structure of a high-voltage, high-electron-mobility transistor (HEMT) comprising gallium-nitride material and having a gate-connected field plate, according to some embodiments.

An example high-voltage HEMT structure is depicted in FIG. 1A, according to some embodiments. A high-voltage HEMT 100 may be formed as a lateral device, and include a source 130, a drain 132, and a gate 140 having a length $L_g$ that controls the flow of current between the drain and source. The gate length $L_g$ may be between approximately 0.1 micron and approximately 3.0 microns, according to some embodiments. The gate, source, and drain may be formed on a same side of a substrate 105 (e.g., on a process surface of the substrate). A lateral HEMT structure has the benefit of not needing through-substrate vias for connecting to a source or drain of the device, which can leave the entire backside of the device available for heat removal. Single-side electrical connections can also make integration of the high-voltage HEMT into an integrated circuit (IC) an easier task.

A high-voltage HEMT 100 may be formed using a multi-layer structure that includes a substrate 105, a buffer layer 112, a conduction layer 114, a barrier layer 116, and at least one electrically-insulating dielectric layer 120. Some embodiments may, or may not, include a semiconductor cap layer 118, which may be formed of a same material as the conduction layer 114. A HEMT may further include a source contact 160 and a drain contact 162. Although one device is depicted in FIG. 1A, many HEMT devices may be formed on a substrate.

A high-voltage HEMT 100 may further include at least one gate-connected field plate 145 that is electrically connected to the gate 140 and extends beyond edges of the gate. According to some embodiments, the gate 140 may be located closer to the source 130 than the drain 132, though the gate may be centered or located nearer the drain in other embodiments. A first extension 147 of the gate-connected field plate 145 may extend a first distance $L_1$ beyond an edge of the gate 140 towards the drain 132. A second extension 143 of the gate-connected field plate 145 may extend a second distance $L_2$ beyond an edge of the gate 140 towards the source 130. In some cases, $L_1 > L_2$. In some implementations, $L_2$ is between approximately 25% and approximately 75% of $L_1$. In some embodiments, $L_2$ is between approximately 10% and approximately 40% of $L_1$. In some embodiments, the first extension length $L_1$ may be between approximately 1 micron and approximately 3 microns. An edge of the gate 140 and a nearest edge of the drain 132 may be separated by a gate-to-drain distance $L_{GD}$. According to some embodiments, $L_{GD}$ is between approximately 2 microns and approximately 20 microns. In some implementations, an insulating passivation layer (not shown) may be formed over the gate-connected field plate 145 and source and drain contacts 160, 162.

Figure 1B:
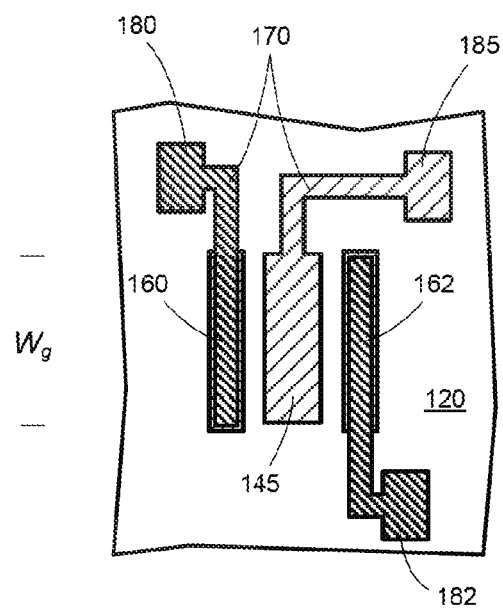
FIG. 1B depicts a plan view of a GaN HEMT, according to some embodiments.
Figure 1C:
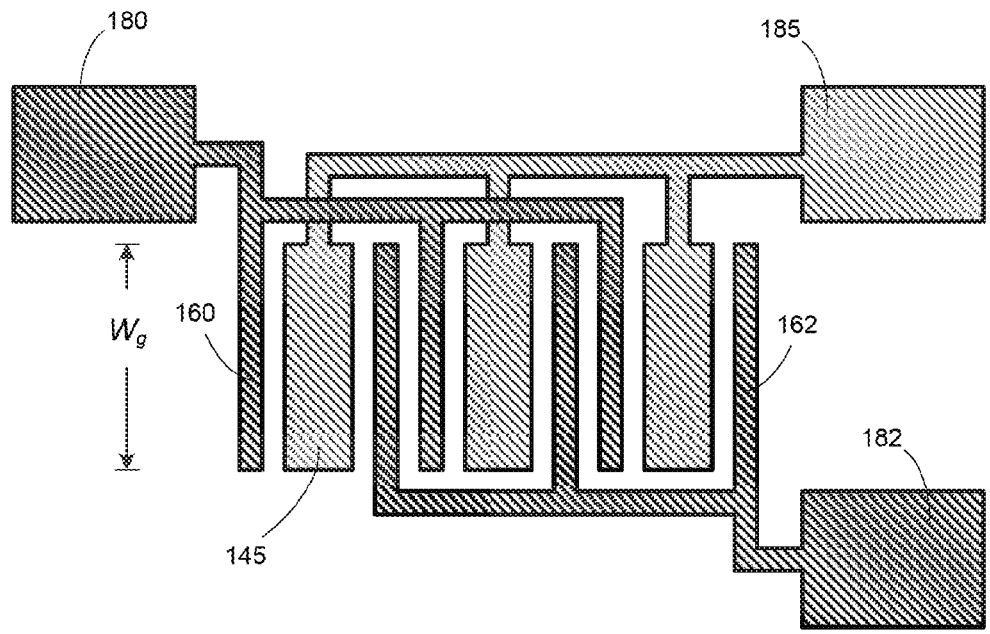
FIG. 1C depicts a plan view of multiple source, gate, and drain contacts for a high-voltage GaN HEMT, according to some embodiments.

In a plan view, a high-voltage HEMT 100 may be arranged as depicted in FIG. 1B or FIG. 1C. The source, gate, and drain may have extended lengths in one direction and run parallel to each other, according to some embodiments. In some embodiments, a high-voltage HEMT may include conductive leads 170 (e.g., interconnects patterned during a metallization level) that extend between a gate or gate-connected field plate 145 and a gate contact pad 185, between a source contact 160 and a source contact pad 180, and between a drain contact 162 and a drain contact pad 182. The contact pads may be significantly larger than depicted in the drawing, and may be significantly larger than the gate, source, and drain contacts. In some embodiments, the gate-connected field plate 145, conductive leads 170, source contact 160, drain contact 162, and contact pads 180, 182, 185 may be formed from a same metallization level. In other embodiments, at least some of these conductive elements may be formed using different materials and depositions. The structures depicted in FIG. 1B or FIG. 1C may be repeated across a substrate many times. In FIG. 1C, drain contacts 162 may be shared between two adjacent transistors and source contacts 160 may be shared between two adjacent transistors when the structures are repeated many times across a substrate.

In further detail, a high-voltage HEMT may be formed on any suitable crystalline substrate 105. Example substrates include, but are not limited to, silicon (Si), silicon carbide (SiC), gallium nitride (GaN), and sapphire. According to some embodiments, the substrate 105 may comprise bulk monocrystalline silicon. In some instances, the substrate may comprise a semiconductor on insulator (SOI) substrate where the semiconductor is any of the foregoing mentioned semiconductor substrate materials. The substrate 105 may be in the form of a wafer (e.g., a Si semiconductor wafer) and have a diameter between approximately 50 mm and approximately 450 mm. In various embodiments, the surface of the substrate is monocrystalline, so that a III-nitride (e.g., GaN, AlN, AlGaN, InGaN) or any other suitable crystalline material, such as III-V, II-VI, tertiary, or quarternary semiconductor materials, may be epitaxially grown from the surface of the substrate.

Because there may be a lattice mismatch between the substrate 105 and the conduction layer 114, one or more transitional layers may be formed on the substrate as buffer layer 112 to ameliorate stress that would otherwise develop from the lattice mismatch. The transitional layers may be formed by epitaxial growth, according to some embodiments. For example, any of the transitional layers may be formed using a chemical vapor deposition (CVD) process or atomic layer deposition (ALD) process. A CVD process may include, but not be limited to, a metal-organic chemical vapor deposition (MOCVD) process. Other deposition processes may include hydride vapor phase epitaxy (HVPE) or molecular beam epitaxy (MBE). The transitional layers may include at least a first transitional layer (e.g., AlN) deposited directly on the substrate 105 followed by one or more gallium-nitride material layers deposited on the first transitional layer. Examples of transitional layers 112 are described in, for example, U.S. Pat. Nos. 7,135,720 and 9,064,775, which are both incorporated herein by reference in their entirety. Some of the transitional layers may be compositionally graded. A total thickness of the buffer layer 112 may be between approximately 0.5 micron and approximately 4 microns.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_xP_yN_{(1-x-y)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped. Suitable gallium-nitride materials are described in U.S. Pat. No. 6,649,287, which is incorporated herein by reference in its entirety.

Some implementations may include additional layers (not shown) within the depicted multi-layer structure of FIG. 1A. For example, there may be one or more additional layers between the substrate 105 and conduction layer 114. These layers may include any combination of the following layers: amorphous dielectric (e.g., silicon nitride, oxide) layer(s) compositionally graded layer(s), and strain-relieving layer(s). Such layers may be included to ameliorate stresses arising from deposition of dissimilar materials and/or to improve electrical performance of the device (e.g., reduce parasitic capacitance or leakage currents).

According to some embodiments, the conduction layer 114 may comprise gallium nitride (GaN) or any suitable gallium-nitride material. The conduction layer 114 may be formed by epitaxial growth (e.g., by an MOCVD process or any suitable process for forming a crystalline gallium-nitride material), and may be deposited directly on or above the buffer layer 112. A thickness of the conduction layer may be between approximately 0.5 micron and approximately 4 microns. In some embodiments, the conduction layer may be undoped, though it may be lightly doped (for either n or p type conductivity) in other embodiments. A band-gap of the conduction layer 114 may be smaller than a band-gap of an adjacent barrier layer 116.

The inventors have found that it is desirable to have a combined thickness of the buffer layer 112 and conduction layer 114 to be at least 4.5 microns, in some embodiments. This can avoid limiting the device's reverse-bias breakdown voltage due to the vertical epitaxial profile. In some cases, the combined thickness of the buffer layer and conduction layer is at least 4.0 microns to avoid limiting the device's breakdown voltage due the vertical epitaxial profile. When the combined thickness of the buffer layer 112 and conduction layer 114 is less than these values, larger vertical leakage currents and defects can contribute to device breakdown at lower voltages.

A barrier layer 116 may be formed using any suitable epitaxial growth process, and may be deposited directly on or above the conduction layer 114, in some embodiments. A thickness of the barrier layer 116 may be between approximately 10 nanometers and approximately 50 nanometers, though other thicknesses may be used in some cases. According to some embodiments, the barrier layer 116 may comprise any suitable gallium-nitride material, and may comprise one or more layers of different gallium-nitride materials (e.g., AlGaN and AN layers). The barrier layer may be doped for either n or p type conductivity, or may be undoped.

The barrier layer 116 and conduction layer 114 may form a heterojunction, and thereby create a two-dimensional electron gas (2DEG) 150 in the conduction layer 114 adjacent to the interface between the conduction layer and barrier layer. The 2DEG 150 may provide a highly conductive path for current flowing between the source 130 and drain 132. According to some embodiments, the conduction layer 114 comprises undoped gallium nitride (GaN), and the barrier layer comprises undoped aluminum-gallium nitride (AlGaN) having an Al percentage (by mole fraction) between approximately 20% and approximately 40%. In some cases, the barrier layer comprises AlGaN having a mole fraction of Al between approximately 24% and approximately 29%.

When using the terms "on," "adjacent," or "over" to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and/or implemented in other orientations than shown in the drawing (for example, rotated about a horizontal axis by more than 90 degrees.

Some embodiments may include a semiconductor cap layer 118 formed over the barrier layer 116. The semiconductor cap layer may comprise a semiconductor material of the same type as the conduction layer 114. The cap layer 118 may or may not be doped. In some implementations, the cap layer may comprise a layer of undoped or doped GaN. The cap layer 118 may have a thickness between approximately 1 nm and approximately 10 nm. The cap layer may be formed by any suitable epitaxial deposition process (e.g., by ALD or a CVD process). Some implementations may not include a cap layer 118.

The conduction layer 114, barrier layer 116, and cap layer 118 may have low defect densities that are typical for integrated-circuit-grade semiconductor materials. For example the defect density for each layer may be as high as, but not greater than approximately $10^9$ cm$^{-2}$ in some implementations, and as high as, but not greater than approximately $10^8$ cm$^{-2}$ in some embodiments. Defect densities may be higher in the buffer layer 112 or in portions of the buffer layer.

Although one gate-connected field plate is shown in FIG. 1A, two or more gate-connected field plates may be used in other embodiments. Examples of additional field plates that may be connected to the gate are described as anode-connected field plates in U.S. provisional application No. 62/323,569, filed Apr. 15, 2016, titled "High-Voltage Lateral GaN-on-Silicon Schottky Diode with Reduced Junction Leakage," which is incorporated herein by reference in its entirety.

Any suitable electrically insulating layer 120 may be used to isolate one or more gate-connected field plates from the barrier layer 116 or cap layer 118. Example insulator materials include, but are not limited to silicon nitride, silicon oxide, hafnium oxide, aluminum oxide, lanthanum oxide, titanium oxide, zinc oxide, zirconium oxide, gallium oxide, scandium oxide, aluminum nitride, and hafnium nitride. An insulating layer may be formed by any suitable deposition process, such as chemical vapor deposition, plasma-enhanced chemical vapor deposition, atomic layer deposition, sputtering, or electron-beam evaporation. Other deposition processes may be used in other embodiments.

According to some embodiments, the gate 140, source 130, drain 132, gate-connected field plate 145, and source and drain contacts 160, 162 may be formed from a metal, a metal silicide, metal alloys, a plurality of metal layers, or a highly-doped amorphous semiconductor. In some implementations, any of the gate, source, drain, gate-connected field plate, and contacts may comprise one or more layers of the following metals and/or metal alloys in any suitable combination: titanium, nickel, chromium, platinum, palladium, osmium, aluminum, gold, tungsten, rhenium, tantalum, and alloys of titanium and tungsten. In some cases, one or more of the following silicides may be used: platinum silicide, tungsten silicide, nickel silicide, cobalt silicide, titanium silicide, molybdenum silicide, and tantalum silicide. Any of the gate, source, drain, and field-plate elements may be formed by a physical deposition process (e.g., electron-beam deposition, sputtering, or plating process). A thickness of a gate, source, and/or drain may be between approximately 20 nm and approximately 200 nm, though other thicknesses may be used in some cases. A thickness of a gate-connected field plate 145 may be between approximately 100 nm and approximately 1.5 microns. A thickness of a source and/or drain contact 160, 162 may be between approximately 200 nm and approximately 2 microns.

In some embodiments, the gate 140, source 130, drain 132, and gate-connected field plate material 145 may be formed from different material compositions. For example, source 130 and drain 132 may comprise a multi-layer structure such as, but not limited to, Ti/Al/Ni/Au, Ti/Al/W, or Ta/Al/Ta. The gate 140 may comprise a multi-layer structure such as, but not limited to, Ni/Pd/Au/Ti, Ni/Pt/Au/Ti, Ni/Ti/Al/W, Ni/W/Al/W, Ni/Ta/Al/Ta, Ni/Ta/Al/W, Ni/NiO/Al/W, Ni/NiO/Ta/Al/Ta, Ni/NiO/Ta/Al/W, W/Al/W, Ni/WN/Al/W, Ni/NiO/W/Al/W, Ni/NiO/WN/Al/W, WN/Al/W, or Pt/Au/Ti compositions. A gate-connected field plate 145 may comprise, but not be limited to, Ti/Pt/Au, Al/Cu, or TiN/Cu compositions.

In some implementations, isolation regions 115 may be formed around one or more HEMTs to prevent inflow or outflow of leakage current to or from a HEMT to an adjacent circuit element. Isolation regions may comprise shallow trench isolation structures (e.g., trenches filled with an oxide or other insulator), in some cases, or may comprise regions of damaged crystalline semiconductor in other embodiments. The inventors have recognized and appreciated that effective isolation regions may be formed in gallium-nitride materials by damaging the crystal lattice structure with ion implantation (e.g., implanting nitrogen, argon, boron, or phosphorus). In some embodiments, an isolation region may be formed around one or more HEMTs by implanting a peripheral region with nitrogen at multiple different energies. The different implantation energies are used to extend the damaged region around the HEMT from the top of the barrier layer 116 (or cap layer if present) to a depth of at least 100 nm. Forming isolation regions 115 by ion implantation can be easier than process steps associated with forming a field oxide around the HEMTs.

There may be several additional dimensions associated with a high-voltage HEMT. In some embodiments, the gate widths $W_g$ (referring to FIG. 1B) may be between approximately 10 microns and approximately 1000 microns, though larger widths may be used in some devices. The lengths of the source and drain $L_c$ may be between approximately 1 micron and approximately 10 microns. A distance between the gate 140 and source 130 may be between approximately 0.5 microns and approximately 5 microns.

Although only one or few HEMT structures are depicted in the drawings, many HEMT structures may be fabricated in parallel on a substrate 105. For example, the substrate 105 may comprise a semiconductor wafer and hundreds, thousands, or millions of the described HEMT structures may be fabricated on the semiconductor wafer. Some HEMTs may be connected together on a die to a common gate contact pad (and source and drain contact pads) and comprise multiple gates, sources, and drains of discrete HEMT devices, as depicted in FIG. 1C for example, so that larger currents can be handled by a single HEMT chip.

The inventors have recognized and appreciated that structure relating to the gate 140, gate-connected field plate(s) 145, insulating layers 120, gate-to-drain spacing $L_{GD}$, and extension of the field-plate edge $L_1$ toward the drain can critically determine a reverse-bias breakdown voltage for a high-voltage HEMT. The inventors recognized the influence of these features on device breakdown characteristics in view of several numerical simulations that were carried out to calculate the magnitude of electric fields in different HEMT-like structures and in view of different devices that were fabricated and tested. An example structure used in the simulations and results from simulations are described below in connection with FIG. 2 through FIG. 5B.

Figure 2:
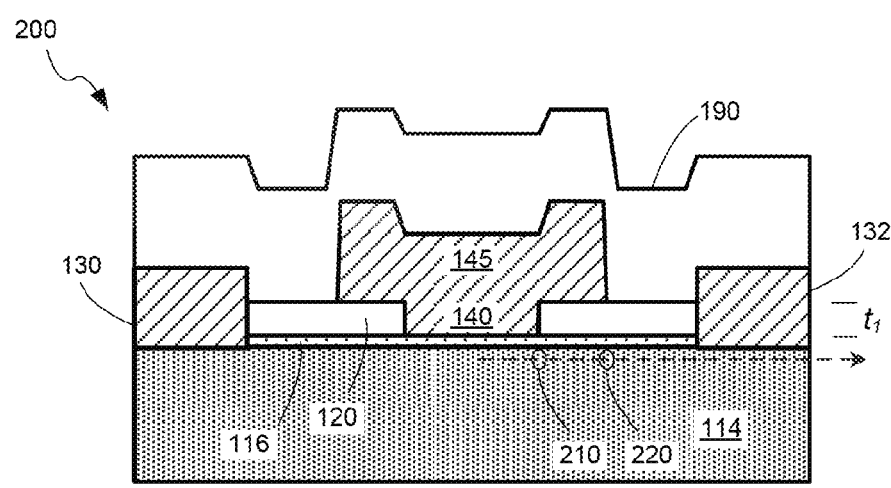
FIG. 2 is an elevation view depicting structure of a device having a gate-connected field plate that was used for numerical simulations, according to some embodiments.

FIG. 2 depicts a HEMT-like structure 200 having a single gate-connected field plate 145 that was used for a first set of numerical simulations to evaluate electric fields within the device under various bias conditions. The structure 200 used in the simulations comprised a Schottky diode, in which the anode was similar to the gate of a HEMT and two cathodes spaced on either side of the anode were similar to the source and drain. The device is structurally similar to a HEMT and provided an approximate understanding of electric fields within the device. The simulated structure 200 comprised a GaN conduction layer 114, an AlGaN barrier layer 116, a gate 140, a source 130, a drain 132, and a gate-connected field plate 145. To simplify the simulations for initial evaluations of electric fields, the device was arranged symmetrically with the gate (anode) mid-way between the source 130 and drain 132 (cathodes), and with equal gate-connected field-plate extensions $L_1$ toward the source and drain.

An electrically insulating layer 120 (silicon nitride) was included above the AlGaN barrier layer, and a passivation layer 190 (silicon nitride) was included over the device. For the simulations, a surface-state donor density at the interface of the AlGaN barrier layer 116 and the GaN conduction layer was approximately $5 \times 10^{12}/cm^2$. This surface-state density was found to be high enough to provide transistor behavior in the device. At a lower density ($5 \times 10^{12}/cm^2$), transistor behavior was not observed.

For a first set of simulations, the gate length $L_g$ was fixed at about 1 micron, and the gate-to-drain distance $L_{GD}$ was fixed at 10 microns. For these simulations, the extension $L_1$ of the gate-connected field plate was approximately 5 microns. In a first case, a reverse bias of 100 V was applied between the drain and the gate. In a second case, a reverse bias of 500 V was applied between the drain and gate. The reverse bias essentially created a large potential drop between the drain and gate, simulating conditions of a reverse biased HEMT. Plots of the electric field for each case are shown in FIG. 3.

Figure 3:
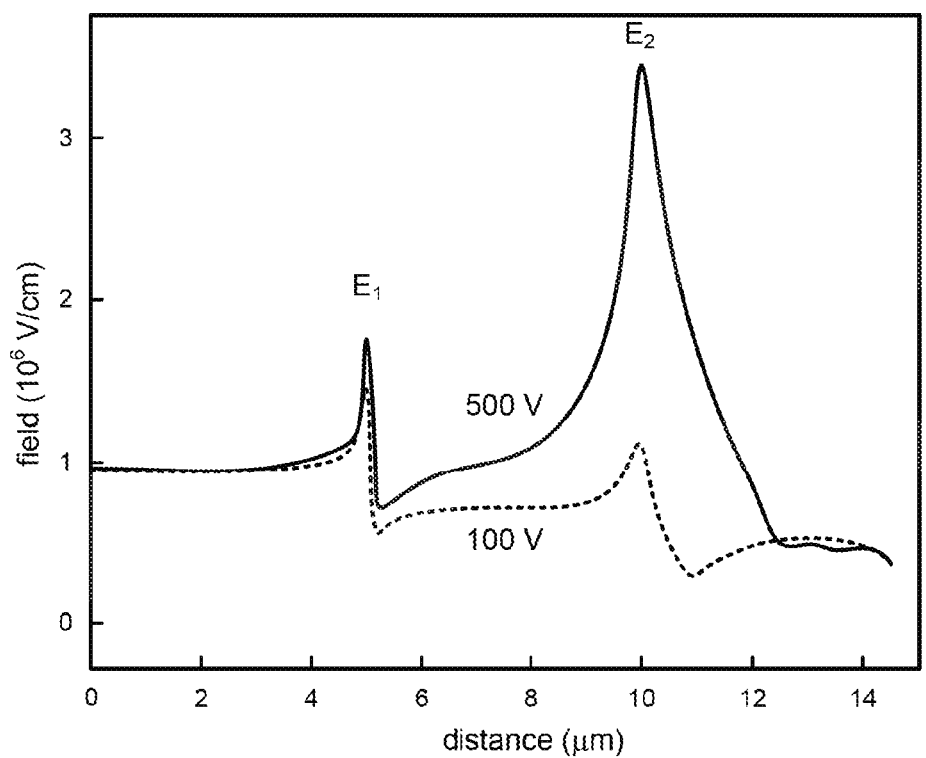
FIG. 3 illustrates calculated electric field profiles along a GaN conduction layer (location and direction indicated approximately by the dashed arrow in FIG. 2) at two reverse-bias potentials, according to some embodiments.

The plots in FIG. 3 illustrate the total value of electric field determined along the region of the conducting 2DEG in the conduction layer 114, indicated by the dashed arrow in FIG. 2. The electric field values are plotted for one side of the symmetric structure. Each plot shows a first peak in the electric field $E_1$ that appears below a drain-side edge of the gate 140, depicted as region 210 in the conduction layer 114 in FIG. 2. A second peak $E_2$ appears in the electric field below an edge of the gate-connected field plate 145, depicted as region 220. Other reverse-bias potentials were also simulated. It was observed that the first electric-field peak $E_1$ tends to saturate with increasing reverse bias to a value below $2 \times 10^6$ V/cm. The second electric-field peak $E_2$ increases in value to over $3 \times 10^6$ V/cm as the reverse bias is increased. Since the conduction layer comprises GaN with an intrinsic field strength of about $5 \times 10^6$ V/cm, the reverse-bias potential applied to the HEMT, according to this embodiment, may be increased further (to at least 800 V) before breakdown is observed.

The inventors have recognized and appreciated that the gate-connected field plate 145 can spread the electric field in the conduction layer, and help suppress the first electric-field peak $E_1$, which forms at the edge of the gate 140. Without the gate-connected field plate 145, the first electric-field peak $E_1$ would rise to a breakdown value well before a reverse bias of 800 V.

Figure 4:
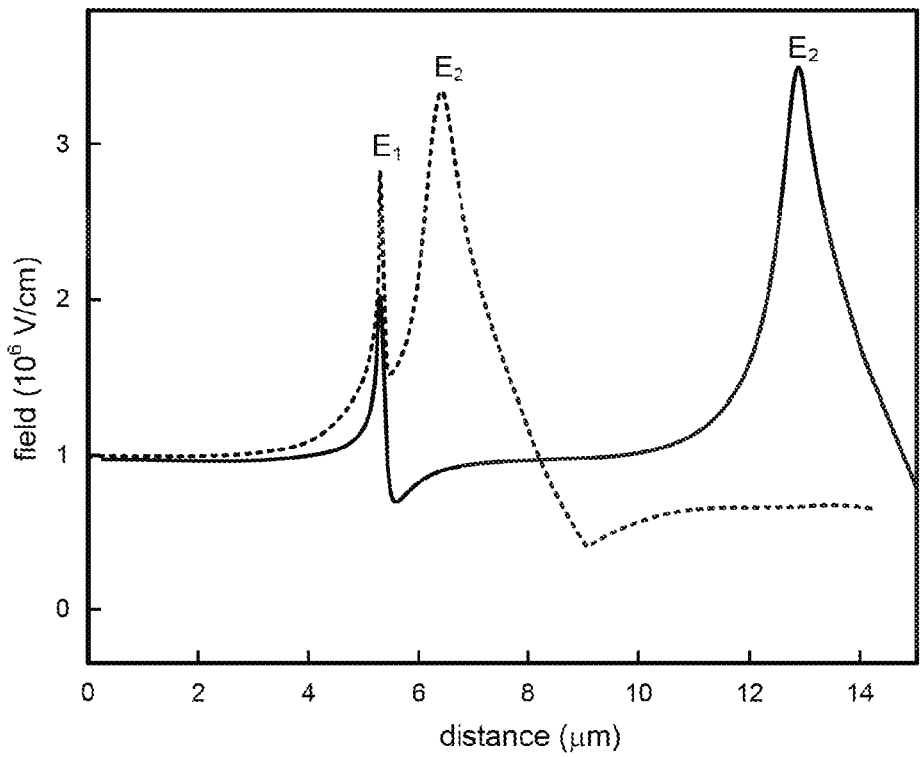
FIG. 4 illustrates calculated electric field profiles along a GaN conduction layer for the structure depicted in FIG. 2 for two gate-connected field-plate lengths $L_1$ (extending towards the drain) at a reverse-bias potential of 500 volts, according to some embodiments.

Additional simulation were carried out to evaluate the effect of changing the extension length $L_1$. The results from these simulations are shown in FIG. 4. For these simulations, a reverse bias of 500 V was applied between the drain and source. In these simulations, the extension length $L_1$ of the gate-connected field plate was changed from 1 μm to 7.5 μm. In the first simulation, shown as the dotted line in FIG. 4, the outer edge of the gate-connected field plate extending toward the drain 132 was located about 1 μm beyond the outer edge of the gate 140. For this case, the first peak $E_1$ in the electric field was just below $3 \times 10^6$ V/cm, and the second peak $E_2$ exceeded $3 \times 10^6$ V/cm. Other extension lengths $L_1$ that were simulated included 2.5 μm, 5 μm, and 7.5 μm. It was found that increasing the extension length of the gate-connected field plate has little effect on the magnitude of the second electric-field peak $E_2$, although a reduction in the first electric-field peak $E_1$ was observed with an increase in $L_1$. For example, in the fourth trial, shown as the solid line, the field-plate extension length was 7.5 μm, and although the value of the first electric-field peak reduced, the second electric-field peak $E_2$ remained at approximately the same value, just over $3 \times 10^6$ V/cm.

Further simulations were carried out for the structure depicted in FIG. 2 to evaluate changes in the magnitudes of the electric-field peaks $E_1$ and $E_2$ due to varying the thickness $t_1$ of the insulating layer 120. The field-plate extension length $L_1$ was also varied in these simulations. For these simulations, the length $L_g$ was 1 μm, and a distance $L_{GD}$ from the gate to the drain was 10 μm. Also, a reverse bias of 500 V was applied between the drain and source for each case. The insulating layer 120 comprised silicon nitride. The observed changes in electric-field peaks are plotted in FIG. 5A and FIG. 5B.

Figure 5A:
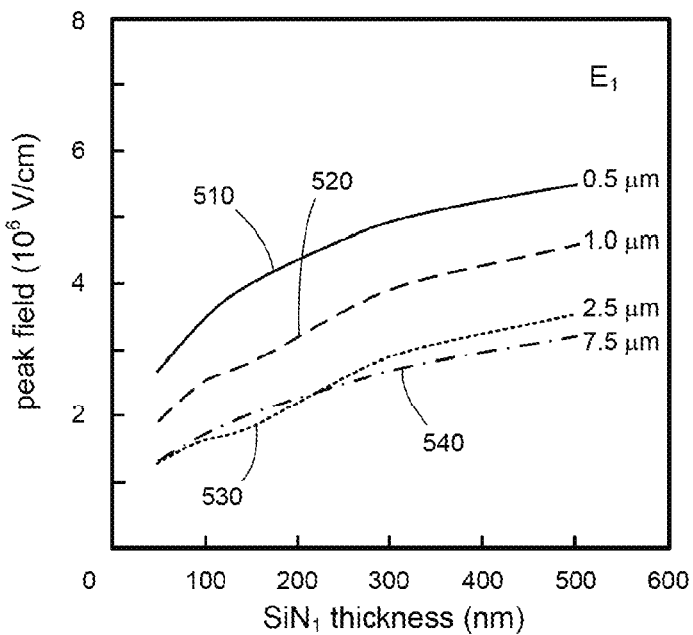
FIG. 5A illustrates the value of the first electric-field peak $E_1$ near the gate edge in the GaN conduction layer as a function of silicon nitride thickness for four different gate-connected field-plate lengths $L_1$.

In FIG. 5A the value of the first electric-field peak $E_1$ (at the gate edge) is plotted as a function of insulating layer thickness $t_1$ for four different field-plate extension lengths $L_1$. A first trace 510 was observed for a field-plate extension length of 0.5 μm. A second trace 520 corresponds to a field-plate extension length of 1 μm. The third trace 530 and forth trace 540 correspond to field-plate extension lengths of 2.5 μm and 7.5 μm respectively. As can be seen from the plots, the magnitude of the first electric-field peak $E_1$ decreases with decreasing thickness in the insulating layer 120. Additionally, the magnitude of the first electric-field peak $E_1$ decreases with increasing extension length $L_1$ of the field-plate.

Figure 5B:
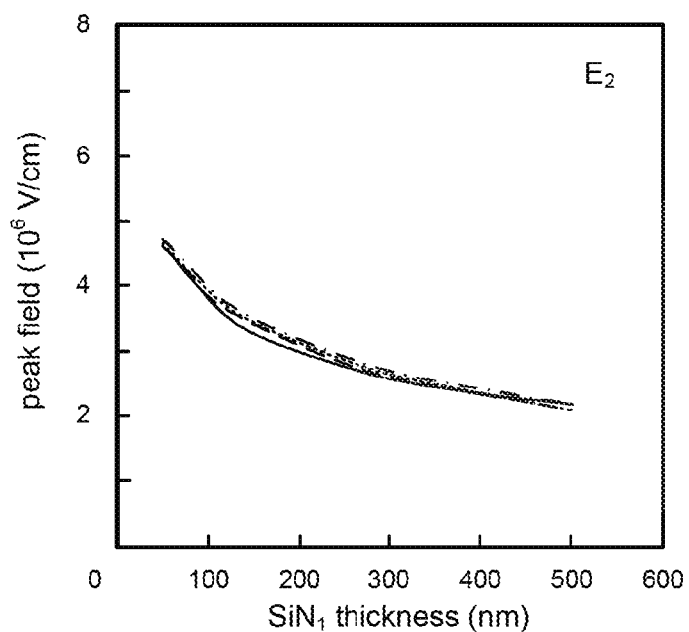
FIG. 5B illustrates the value of the second electric-field peak $E_2$ below the gate-connected field-plate edge in the GaN conduction layer as a function of silicon nitride thickness for four different field-plate lengths $L_1$.

FIG. 5B illustrates plots of the second electric-field peak $E_2$ (at the edge of the field plate) as a function of insulating layer thickness $t_1$ for the same field-plate extension lengths that were trialed for the graph of FIG. 5A. In terms of the second peak $E_2$, the extension length $L_1$ of the field plate has little effect on the value of the second electric-field peak, as observed for the simulation results depicted in FIG. 4. However, the value of the second electric-field peak $E_2$ decreases with increasing thickness $t_1$ of the insulating layer 120. This is an opposite trend from that observed in FIG. 5A. These results suggest that an insulating layer thickness for a single gate-connected field-plate design is preferably in a range between about 100 nm and about 300 nm. The results also indicate that it is beneficial to have the gate-connected field plate 145 extend beyond the outer gate edge by at least one micron, but that extensions beyond about 3 microns have little added benefit. Since these simulations were carried out for a Schottky diode, the preferred distances observed above may be slightly different for a HEMT.

Figure 6:
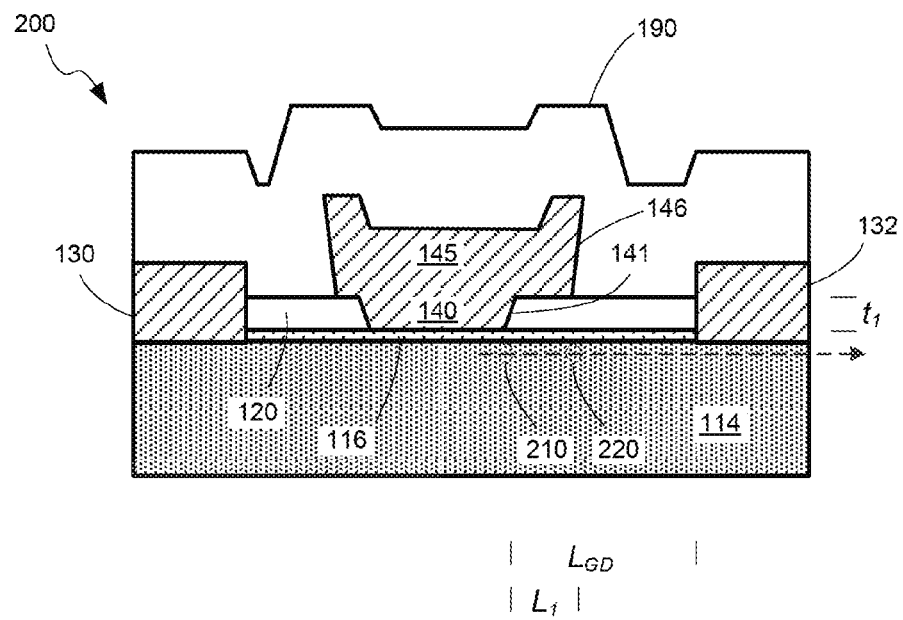
FIG. 6 depicts an elevation view of structure of a high-voltage HEMT having a sloped gate, according to some embodiments.

Referring now to FIG. 6, the inventors have further recognized and appreciated that sloping the gate edges 141 and/or the gate-connected field plate edges 146 can further increase resistance of a HEMT to reverse-bias breakdown. A sloped profile may reduce concentration of the electric field at lower corners of the gate and/or gate-connected field plate. In terms of the gate edge, a slope may provide a thinner dielectric thickness $t_1$ near the gate edge (indicated in FIG. 5A as beneficial for reducing $E_1$) and a thicker dielectric under the field-plate edge (indicated in FIG. 5B as beneficial for reducing $E_2$). In some embodiments, an outward slope of the gate and/or gate-connected field plate edges may be between approximately 5 degrees and approximately 60 degrees from vertical, as indicated in the drawings (e.g., such that the top of the gate is wider than a bottom of the gate.

A large number of HEMT devices having different designs were fabricated on a float-zone silicon wafer. Some devices included gate-connected field plates 145 and, for comparison, some devices did not include field plates 145. In all devices, the gate length $L_g$ was approximately 1 micron. The gate-to-drain spacing $L_{GD}$ varied across devices from approximately 5 microns to 20 microns. For the devices with gate-connected field plates, the drain-side extension length $L_1$ was approximately 1.5 microns for a first set of devices and approximately 3.0 microns for a second set of devices. The thickness of the buffer layer 214 was approximately 2.6 microns. The thickness of the barrier layer was approximately 18 nm, and it had an Al composition of 27% (mole fraction).

For the fabricated devices having only gates and not gate-connected field plates, reverse-bias breakdown voltages $V_B$ were found to vary among devices across the wafer. For these devices, $L_{GD}$ was approximately 20 microns. The reverse breakdown voltage values $V_B$ ranged from 100 volts to as high as 1100 volts.

For HEMTs that included gate-connected field plates, the variation in breakdown voltage was greatly reduced among the devices. For the first set of devices with $L_1 \cong 1.5$ microns, $V_B$ ranged from about 900 volts to at least 1200 volts, which was the limit of the tester. For the second set of devices with $L_1 \cong 3.0$ microns, Vs for all the measured devices were at least 1200 volts.

As described above, a figure of merit for a HEMT is an amount of leakage current that flows in the HEMT when in operation. Ideally, it is desired that a HEMT completely blocks the flow of current to the source or gate when the device is biased in an "off" state. When biased to an off state, the gate 140 may be at a negative potential (e.g., between −5 V and −10 V), and the drain may be at a positive potential. Such a biasing configuration effectively applies a "reverse bias" between the drain and gate. In some cases during operation, the reverse bias can be hundreds of volts or even up to several thousand volts. Such high biases may lead to leakage current that can contribute to power loss or other deleterious effects in the device or in an instrument in which the HEMT is used.

Figure 7:
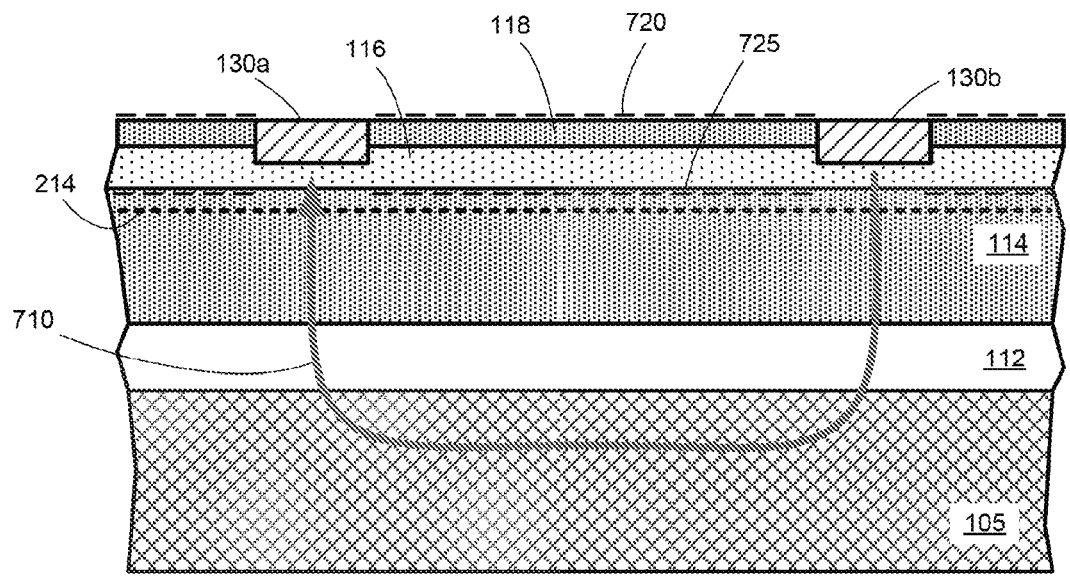
FIG. 7 depicts a semiconductor device structure and leakage current paths associated with a HEMT.

Leakage current in a semiconductor HEMT can be due to several different causes. Some of these causes are depicted in FIG. 7. In some cases, surface states 720 and/or traps 725 may provide pathways for leakage current. The traps may arise from interfacial defects that form at boundaries between different semiconductor layers. In some cases, leakage current may flow between ohmic contacts 130a, 130b (between a source 130 and drain 132, for example) via the 2DEG 150 or a parasitic channel that may form at a boundary between different semiconductor layers. In some devices, leakage current may flow vertically and laterally between ohmic contacts (e.g., along a path 710 depicted in FIG. 7). For example, leakage current may flow vertically from one ohmic contact 130*b* through one or more gallium-nitride layers and buffer layer 112 to the substrate 105, flow laterally along the substrate, and then flow vertically to a second ohmic contact 130*a*. In some cases, ohmic contacts 130*a* and 130*b* may be ohmic contacts of different devices that are adjacent to each other on a die.

Different approaches for reducing leakage current were tried. In some devices, mesas were formed to help isolate ohmic contacts. For example, trenches were etched around or adjacent to ohmic contacts in non-active regions to reduce unwanted current flow via surface and/or trapping states and the 2DEG between ohmic contacts (e.g., between contacts of adjacent devices or other device contacts). The inventors found that mesa formation did not significantly reduce leakage-current flow, and in some cases unexpectedly increased leakage-current flow. The increase in leakage current was believed to be due to the generation of more defect states and surface states from the etching process used to form the mesas.

Figure 8A:
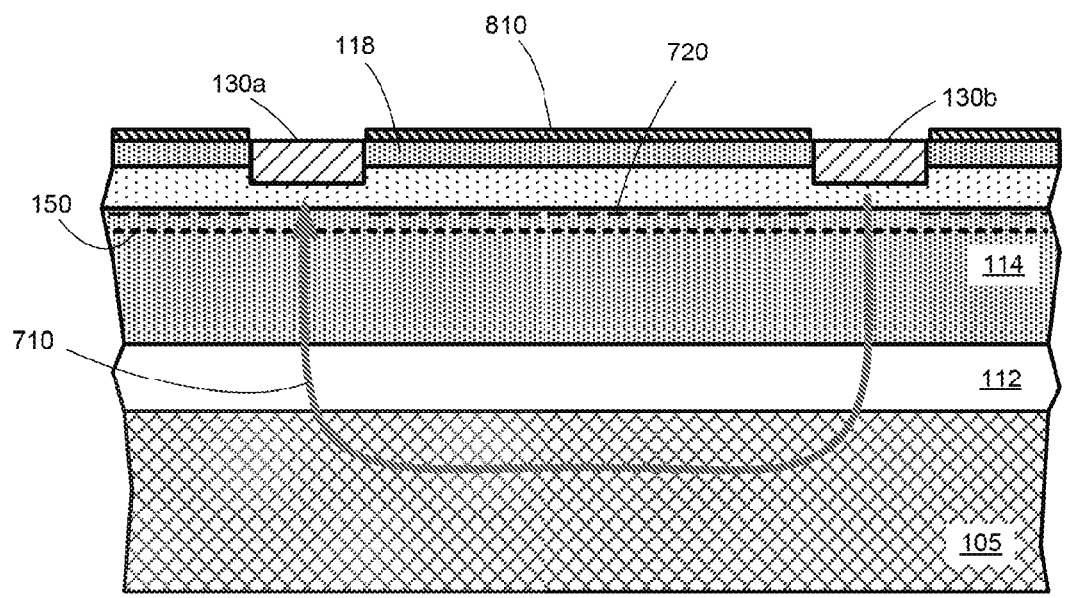
FIG. 8A depicts passivation of surface states, according to some embodiments.

In some devices, a silicon-nitride passivation layer 810 may be formed in regions around ohmic contacts 130*a*, 130*b* (such as the source and drain contacts), as depicted in FIG. 8A. The passivation layer can passivate the surface states 720 and appreciably reduce a component of leakage current due to surface-state currents. The inventors found that silicon nitride was more effective at passivating surface states and reducing leakage current than oxide material.

Figure 8B:
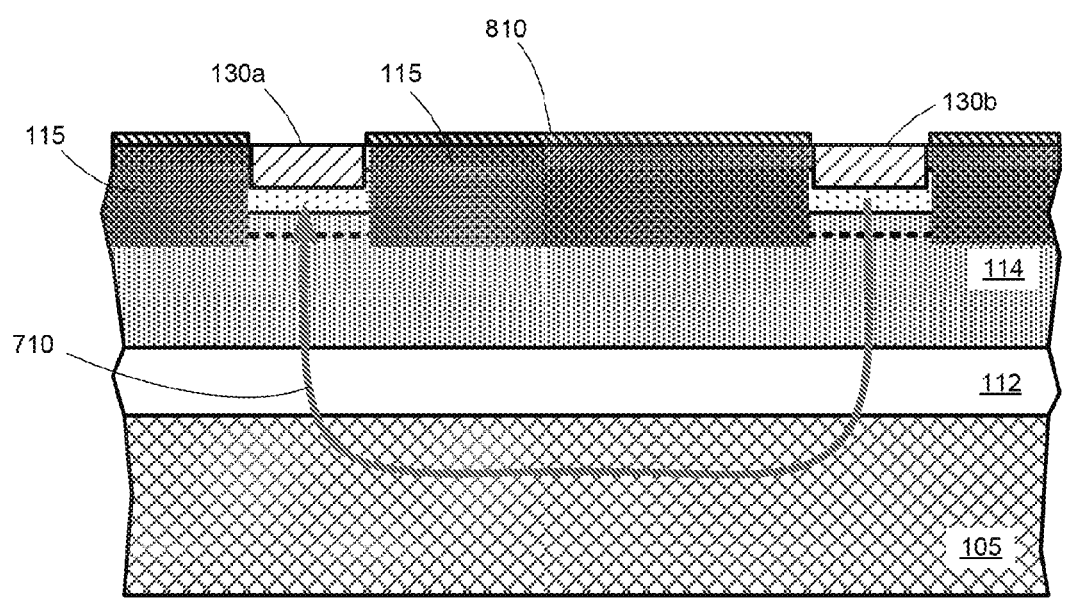
FIG. 8B depicts formation of isolation regions by ion implantation, according to some embodiments.

In some devices, ion implantation can be used in non-active regions of the device alternatively, or in addition to, a passivation layer 810. The ion implantation may form electrical isolation regions 115 within the semiconductor layers, as depicted in FIG. 8B. The ion implantation can damage the crystalline structure, and thereby increase its resistance to leakage current flow.

Several different ion species (boron, nitrogen, and phosphorus) were implanted in different HEMT devices as isolation regions 115 to evaluate their effect on reducing leakage current. The inventors found that implanted nitrogen provided the largest reduction in leakage current among the different ion species. Additionally, a larger reduction in leakage current can be obtained when the nitrogen is implanted at a plurality of different energies, so as to extend the damage well into the conduction layer 114. According to some embodiments, nitrogen may be implanted at two or more different energies so that the nitrogen implants to depths to approximately 100 nm below the top surface of the cap layer 118, or below the top surface of the barrier layer 116 if a cap layer is not used. In some cases, the implantation depths may be deeper, for example, up to 200 nm in some embodiments, and up to 500 nm in some embodiments.

Although surface passivation and ion implantation provided useful reductions in reverse-bias leakage current, the inventors surprisingly found that the largest reduction in leakage current is obtained when a pre-treatment process is used prior to deposition of the gate 140. In conventional gate patterning, an insulating layer 120 (see FIG. 9, for example) may be etched to expose the underlying barrier layer 116 or cap layer 118 for the gate structure. The gate may then be deposited in electrical contact with the exposed AlGaN or gallium nitride cap layer. The inventors have found that prior to depositing the gate, subjecting the exposed layer (either the barrier layer or cap layer) to an oxygen plasma can significantly reduce reverse-bias leakage current to the gate in a gallium-nitride HEMT. In some embodiments, the exposed cap or barrier layer is subjected to an $O_2$ plasma having a pressure between about 0.5 Torr and about 3 Torr, and an applied power between about 0.3 kW and about 2 kW. The treatment time may be between about 10 sec and about 2 minutes, according to some embodiments. In some embodiments, the pressure is about 1.5 Torr with a power of about 1.0 kW for a duration of about 30 sec. Referring to the HEMT 900 in FIG. 9, the $O_2$ plasma treatment is believed to form a thin gallium-oxide layer 910 under the subsequently deposited gate 140. The gallium-oxide layer may be between about 10 Angstroms and about 50 Angstroms thick. This thin oxide layer significantly reduces reverse-bias leakage current flow.

In some cases, other gases may be included in the $O_2$ plasma treatment to help passivate the exposed surface. Other gases may include, but are not limited to nitrogen, hydrogen, argon, and forming gas (a mixture of hydrogen and nitrogen having about 5% hydrogen).

Figure 9:
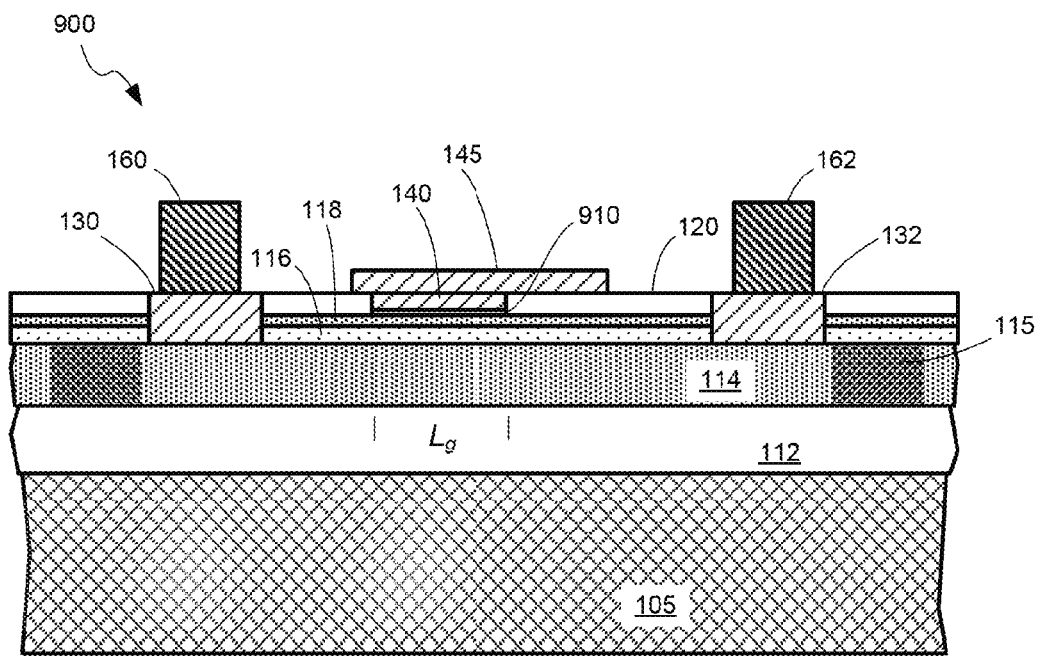
FIG. 9 depicts an elevation view of structure of a high-voltage HEMT that includes an $O_2$ treatment of a gallium-nitride layer prior to gate deposition, according to some embodiments.

The device shown in FIG. 9 may exhibit higher resistance to high-voltage breakdown than devices that do not employ an $O_2$ plasma pre-treatment. According to some embodiments, a HEMT may include a thin gallium-oxide layer 910 formed between the gate 140 and cap layer 118 or barrier layer 116. The gate 140 may be offset and located closer to the source 130 than the drain 132. Additionally, the field-plate extension toward the source may be less than the field-plate extension toward the drain. For example, $L_2$ may be between approximately $0.1L_1$ and $0.7L_1$.

Figure 10:
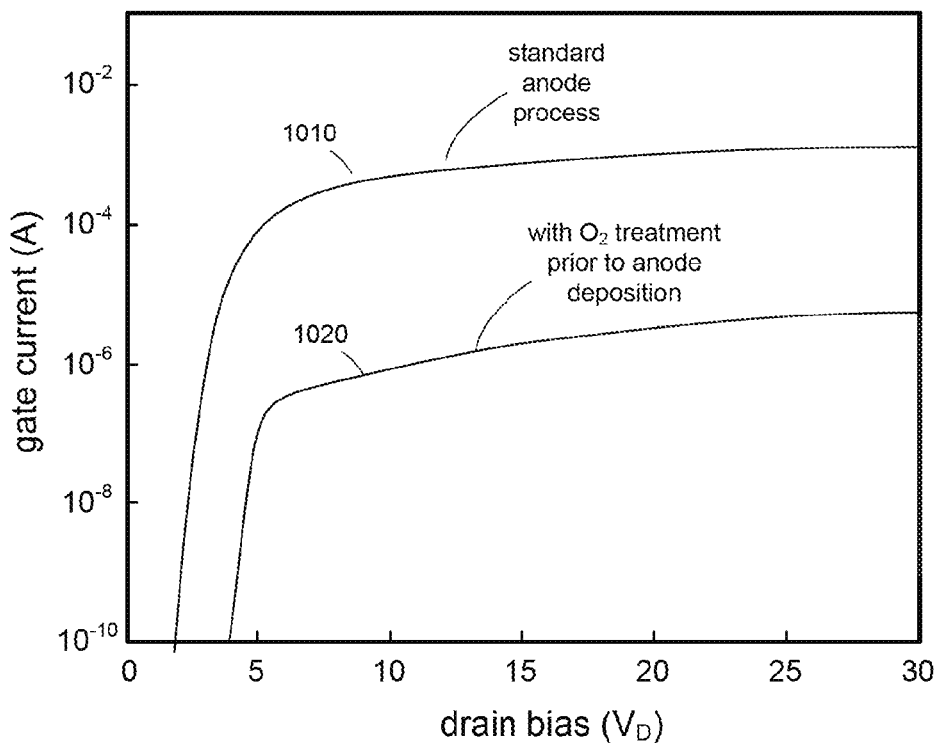
FIG. 10 depicts a reduction in gate leakage current due to an oxygen plasma treatment of a gallium-nitride surface prior to forming a gate, according to some embodiments.

A measured reduction in reverse-bias leakage current due to $O_2$ plasma pre-treatment is shown in FIG. 10. Over sixty HEMT multi-gate devices were tested, for which conventional techniques were used to open a nitride layer 120 and form the gate 140. The gate widths $W_g$ (also referred to as peripheral gate length) were approximately 250 microns. Several different gate lengths were tested. The gate-to-drain length $L_{GD}$ was approximately 4.4 microns for the devices tested. An exemplary leakage-current curve for these devices is plotted as the upper trace 1010 in the graph. Over sixty similar devices were also tested, but in the fabrication of these devices an $O_2$ plasma was used to pre-treat the underlying gallium-nitride surface prior to depositing the gate. A corresponding exemplary leakage-current curve for these devices is plotted as the lower trace 1020 in the graph. For all measurements, the HEMT devices were biased in an "off" state, and a reverse-bias voltage (shown on the horizontal axis) was applied between the drain and source. The leakage current was measured back through the gate.

For the first group of devices for which conventional processing was used to form the gate, the gate leakage current reaches a value on the order of 1 mA at reverse-bias values beyond about 20 volts. For the second group of devices for which the $O_2$ plasma treatment was used prior to deposition of the gate, the gate leakage current reaches a value on the order of 10 µA at reverse-bias values beyond about 20 volts. This value corresponds to a leakage current of approximately 40 µA/mm of peripheral gate length. The reduction in leakage current due to the $O_2$ pre-treatment was approximately a factor of 100. A large reduction in leakage current is obtained for a single additional processing step that can be easily performed.

Although a thin gallium-oxide may be readily formed in a single processing step, other thin oxide or nitride layers may be formed using other processes in other embodiments. For example, a thin nitride or oxide layer (e.g., between 1 nm and 5 nm thick) may be formed at the location of the gate using an atomic-layer deposition process, for example. Any of the above-mentioned insulating layer materials described in connection with insulating layer 120 may be used for the thin nitride or oxide layer.

Figure 11:
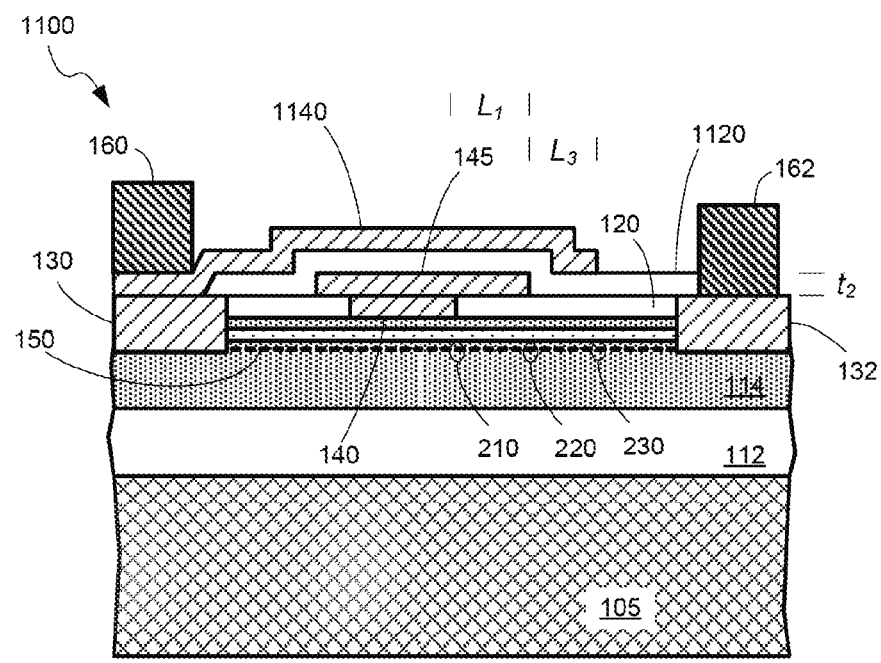
FIG. 11 depicts an elevation view of structure of a high-voltage HEMT that includes a source-connected field plate, according to some embodiments.

The inventors have conceived of additional structure to aid in spreading the biasing electric field in a HEMT and increase the device's resistance to high-voltage breakdown. Referring to FIG. 11, a source-connected field plate 1140 may be formed in a HEMT to electrically connect to the device's source 130 and extend over and beyond the gate 140 towards the drain 132. A source-connected field plate 1140 may also extend over and beyond a gate-connected field plate 145 if the gate-connected field plate is included in the device. The source-connected field plate may extend a distance $L_3$ beyond an edge of the gate-connected field plate toward the device's drain. The source-connected field plate may be formed from any of the above-mentioned conductive materials that are used to form the gate or gate-connected field plate. An electrically insulating layer 1120 (e.g., a nitride or oxide layer) may be deposited to isolate the source-connected field plate 1140 from the underlying gate and/or gate-connected field plate.

Simulations were carried out to evaluate the electric field values in the gallium-nitride conduction layer of a HEMT-like structure having two field-plates formed over the gate 140. The simulations pertained to a Schottky diode in which the two field plates were electrically connected to the diode's anode (which is similar to the gate structure in a HEMT). The simulations provided a qualitative understanding for the HEMT structure depicted in FIG. 11.

In the simulations, the length $L_g$ was fixed at 10 µm, and the distance $L_{GD}$ from the gate edge to the drain edge was also fixed at 10 µm. A passivation layer (not shown in FIG. 11) was included over the device, and a thickness of the first insulating layer 120 was fixed at 50 nm. The extension length $L_1$ of the gate-connected field plate 145 was fixed at 2.5 µm.

Figure 12:
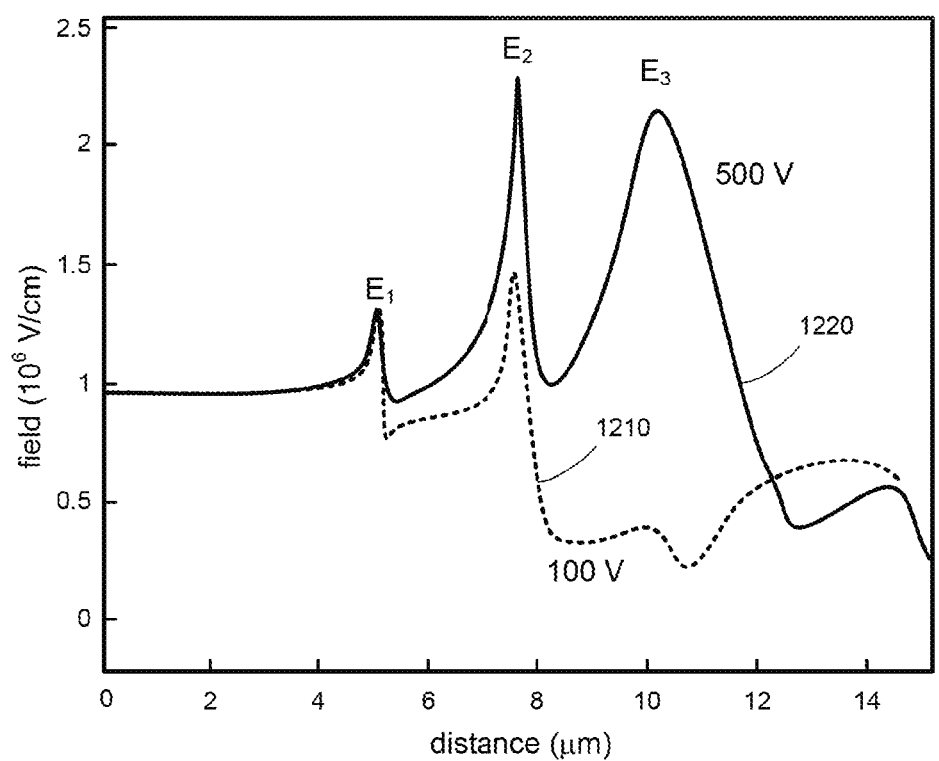
FIG. 12 illustrates calculated electric field profiles along a GaN conduction layer for a HEMT-like structure having two field plates over a gate at two reverse-bias potentials, according to some embodiments.

Examples of electric field values that were calculated along the gallium-nitride conduction layer 114 in the vicinity of the 2DEG 150 for two different reverse-bias potentials are shown in FIG. 12. In a first simulation the reverse bias was 100 V, and the value of the electric field along the gallium-nitride conduction layer 114 is shown as the dashed line 1210. In a second simulation, the reverse bias was 500 V and the value of the electric field is shown as the solid trace 1220. In each case, three peaks in the electric field were observed in the gallium-nitride conduction layer between the gate and the drain. The first peak $E_1$ corresponds to an outer edge of the gate (indicated as region 210 in FIG. 11), located at approximately 5 µm in the simulated structure. The second peak $E_2$ appears below the outer edge of the first gate-connected field plate 145 (indicated as region 220). A third peak $E_3$ appears below the outer edge of the second field plate (indicated as region 230). Similar to the single field-plate design, the value of the first electric-field peak $E_1$ saturates with increasing reverse-bias potential. For this simulated structure, the value of the first electric-field peak $E_1$ reaches about $1.4 \times 10^6$ V/cm. The values of the second and third electric-field peaks, however, increase with increasing reverse-bias voltage. For the simulated structure, the values of the second and third electric-field peaks reach about $2.2 \times 10^6$ V/cm at a reverse bias of about 500 V. Adding a second field plate can reduce the value of the peak electric fields along the conduction layer and near the gate, as can be seen by comparing the plots of FIG. 12 with those of FIG. 3.

In additional simulations, the extension length $L_3$ of the second field plate was varied between the following values: 0.5, 1.0, 2.5, and 5.0 µm. Results from these simulations were similar to those shown in FIG. 4, but with an additional electric-field peak $E_3$ located under the edge of the second field plate.

Further simulations were carried out to observe changes in the peak electric fields $E_1$, $E_2$, and $E_3$ caused by changing a thickness $t_2$ of the second insulating layer 1120. It was found that changes in the thickness $t_2$ of the second insulating layer 1120 (between about 50 nm and about 450 nm) and changes in extension length $L_3$ of the second field plate (between about 0.5 µm and about 5 µm) had little effect on the magnitude of the first electric-field peak $E_1$. On the other hand, the same changes in the insulator thickness $t_2$ and extension length $L_3$ appreciably affected the values of the second electric-field peak $E_2$ and third electric-field peak $E_3$. Increasing the second field-plate extension length $L_3$ decreased the value of the second electric-field peak $E_2$, as did decreasing the thickness of the second insulating layer 1120. Increasing the second field-plate extension length $L_3$ did not appreciably alter the value of the third electric-field peak $E_3$. However, decreasing the thickness of the second insulating layer 1120 increased the value of the third electric-field peak $E_3$, an effect opposite to that on $E_2$.

The results from the simulations for two field plates in a Schottky diode suggest that it may be preferable to use a thicker insulating layer for the second insulating layer in a HEMT to keep the second and third electric-field peak values in the gallium-nitride conduction layer below a breakdown field strength. For example, the second insulating layer 1120 may have a thickness $t_2$ between approximately 300 nm and approximately 600 nm, according to some embodiments, whereas a thickness of the first insulating layer 120 may be between approximately 25 nm and approximately 200 nm.

To assess the simulations, a plurality of different Schottky diode structures were fabricated to evaluate the effect of changes in field-plate extension lengths on breakdown voltages. In the fabricated devices, an extension length L1 of an anode-connected field plate was fixed at approximately 2.5 µm. The distance from the anode edge to the cathode edge (labeled LGD in the drawing) for a first group of devices was approximately 10 µm, and for a second group of devices was approximately 15 µm. Reverse-bias potentials were applied to the devices until the devices exhibited breakdown. An extension length L3 of a second anode-connected field plate on the devices was varied within each group of devices.

Figure 13:
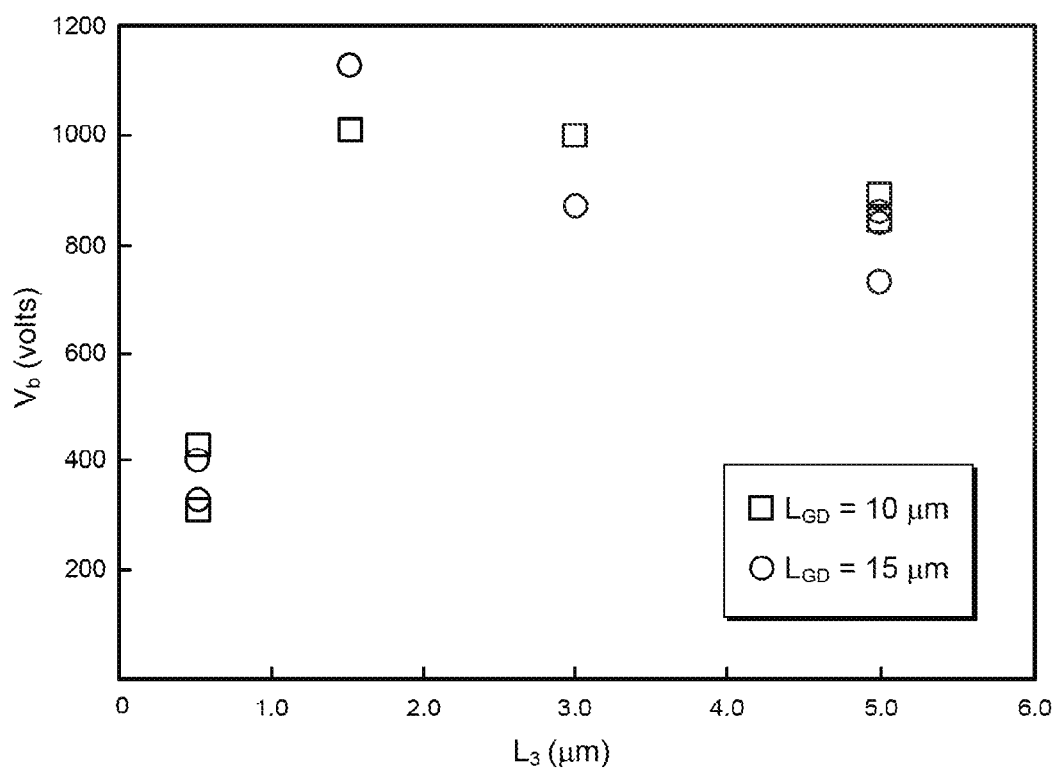
FIG. 13 illustrates the effect of varying the distance between the edges of the two field-plate edges (for the simulated structure of FIG. 12b) on breakdown voltage for two gate-to-drain separations.

Results from the breakdown tests are plotted in FIG. 13. The breakdown voltage $V_b$ observed for the devices is plotted as a function of the extension length $L_3$ of the second field plate. The results show that a significant improvement in breakdown voltage is achieved when the extension length $L_3$ is increased from about 0.5 µm to about 1.5 µm. At about 1.5 µm, breakdown voltages of more than 1000 V were observed for some devices. Increasing the extension length $L_3$ further resulted in a reduction of reverse-bias breakdown voltage. For highest breakdown voltages (e.g., in excess of 900 volts for the tested structure), there exists a critical range of field-plate extension lengths $L_3$ for the second field plate. In this case, the range is between approximately 1.25 µm and approximately 2.5 µm. This critical range is somewhat insensitive to anode-to-cathode spacing in the Schottky diode, since similar results are observed for the two different $L_{GD}$ values, and was expected to be similarly insensitive to gate-to-drain spacing in a HEMT. These results suggest that there is a preferred range of extension length $L_3$ for a source-connected field plate 1140 in a HEMT, and that the range may be around a value of about 2 microns.

In some applications and referring to FIG. 13 again, the range for extension length $L_3$ of a second field plate may be increased for lower breakdown voltages. For example, in some cases $L_3$ may be between approximately 1 µm and approximately 3 µm, or in some instances between approximately 1 µm and approximately 4 µm for breakdown voltage values between about 700 volts and about 1200 volts.

Figure 14:
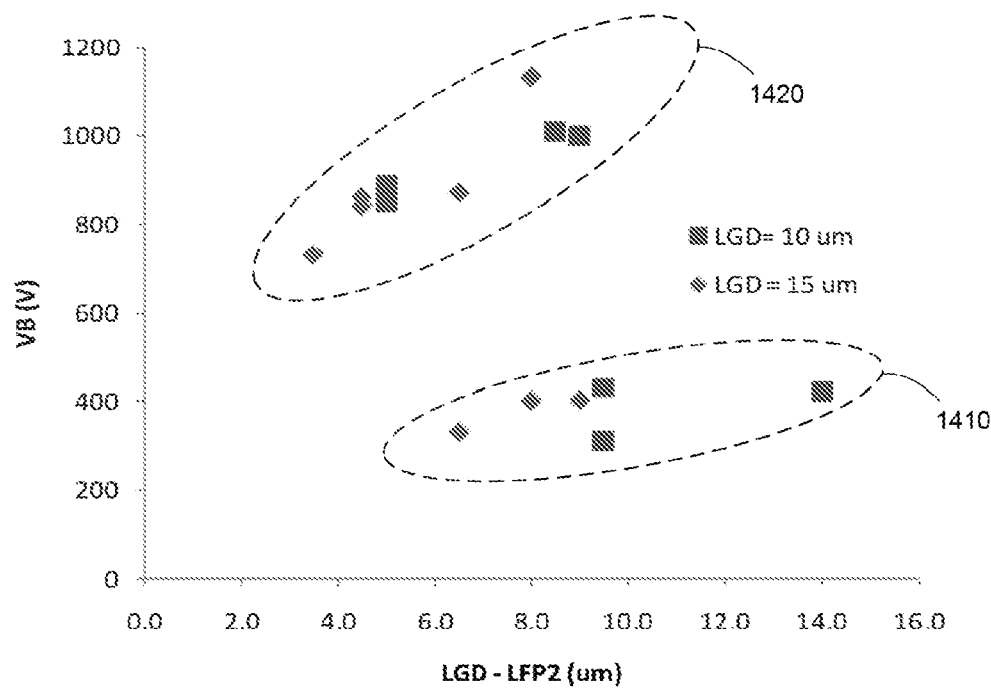
FIG. 14 indicates that encroachment of a second field plate on the drain reduces the value of breakdown voltage for a HEMT-like device.

The inventors determined from the simulation results and trial devices that the distance between the edge of the second field plate (e.g., the edge of the source-connected field plate 1140) and the drain 132 may appreciably affect the device's breakdown voltage value. The dependence on breakdown voltage $V_B$ on this distance (denoted as $L_{GD}-L_{FP2}$) for several fabricated devices is shown in FIG. 14. In this plot, a first group of devices 1410 had a second field-plate extension length $L_3$ of approximately 0.5 µm. As the edge of the second field plate approaches the drain ($L_{GD}-L_{FP2}$ decreases in value), the breakdown voltage reduces in value. The same trend is observed for a second group of devices 1420 having higher breakdown voltages, for which $L_3$ was at least 1.5 µm.

Based upon the above simulations and results from fabricated device, a number of high-voltage HEMTs were fabricated on float-zone silicon wafers to have a structure like that shown in FIG. 11. The HEMTs included a gate-connected field plate and a source-connected field plate. The gate-to-drain spacing $L_{GD}$ for the devices was fixed at approximately 20 µm. The buffer layer 112 thickness was approximately 2.6 µm. The barrier layer 116 was 27% Al (mole fraction), and had a thickness of approximately 18 nm. For a first group of the HEMTs, the gate-connected field-plate extension $L_1$ was approximately 1 µm and the source-connected field-plate extension $L_3$ was approximately 3 µm. For a second group of the HEMTs, the gate-connected field-plate extension $L_1$ was approximately 3 µm and the source-connected field-plate extension $L_3$ was approximately 5 µm. The addition of the source-connected field plate raised the breakdown voltage for all HEMTs to over 1200 V, the limit of the tester.

Figure 15:
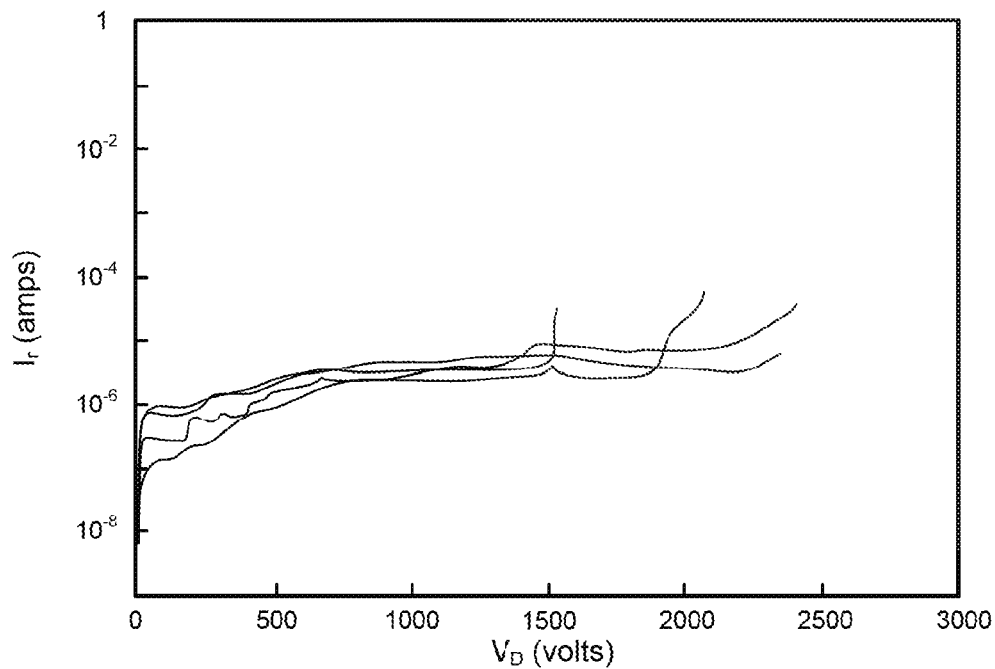
FIG. 15 illustrates reverse-breakdown characteristics for several high-voltage HEMTs, according to some embodiments.

An example of reverse-bias characteristics for fabricated HEMTs having gate-connected and source-connected field plates is shown in FIG. 15. These measurements were made using a system that could access voltages higher than 1200 V. For these HEMTs, the gate-connected field-plate extension $L_1$ was approximately 0.5 µm and the source-connected field-plate extension $L_3$ was approximately 2.5 µm. The gate-connected field-plate extension $L_2$ toward the source 130 was approximately 0.2 µm. All tested devices had a reverse-breakdown voltage over 1500 V. Three of the devices had a reverse-breakdown voltage over 2000 V. Additionally, the average reverse-bias leakage current prior to the run-up near breakdown was between about 1 µA and about 10 µA, corresponding to between about 4 µA/mm and about 40 µA/mm of peripheral gate length. These results are significantly superior to conventional GaN HEMT devices in both breakdown voltage and reverse-bias leakage current.

According to some embodiments, a HEMT may include a source-connected field plate formed over a gate-connected field plate. A thin gallium-oxide layer (between approximately 1 nm and approximately 5 nm thick) may be located between the gate and an underlying gallium-nitride cap layer. The gate length $L_g$ may be between approximately 0.1 µm and approximately 1.5 µm, and edges of the gate may be sloped outward between 5 degrees and 60 degrees from vertical. In some cases, the gate length may be at most 2.0 µm. The gate-connected field plate may extend beyond the gate edge between approximately 0.3 µm and approximately 0.8 µm toward the drain, and may extend beyond the gate edge between approximately 0.1 µm and approximately 0.4 µm toward the source. The source-connected field plate may extend beyond the gate-connected field-plate edge between approximately 1.5 µm and approximately 3.5 µm toward the drain. An edge of the source-connected field plate near the drain may be between approximately 4 µm and approximately 10 µm from an edge of the drain. A thickness of a first insulating layer 120 between the underlying gallium-nitride layer and the gate-connected field plate extension 147 may be between approximately 20 nm and approximately 100 nm. A thickness of a second insulating layer 1120 between the gate-connected field plate 145 and source-connected field plate 1140 may be between approximately 300 nm and approximately 600 nm.

Embodiments of HEMTs as described above may carry large currents at high modulation rates. For example, multi-gate HEMTs (e.g., multiple devices having their gates connected to a common gate contact, sources connected to a common source contact, and drains connected to a common drain contact as in FIG. 1C) having individual gate lengths of approximately 1 µm may handle currents up to 1 Amp/mm (in terms of peripheral gate length $W_g$ as indicated in FIG. 1C) at modulation rates up to 1 GHz. In some cases the gate peripheral lengths may be between 100 microns and 2 mm, though shorter or longer peripheral lengths may be used in some cases. There may be between 2 and 50 HEMTs connected in parallel in a multi-gate HEMT device. According to some embodiments, a multi-gate HEMT device may be configured as a transimpedance amplifier for which the gain remains approximately uniform from the amplifier's low frequency end (as low as $\frac{1}{6}^{th}$ of the amplifier's high-frequency limit) and then drops to about 3 dB at the high-frequency limit (which may be a value between 1 GHz and 30 GHz), while the device can modulate up to 20 Amps of RMS current over this frequency range, and still have reverse-bias leakage currents commensurate with values described above in connection with FIG. 10 and FIG. 15. For example and according to some embodiments, a multi-gate HEMT having individual gate lengths of approximately 0.5 µm may drive currents up to 1 Amp/mm (RMS current value) at modulation rates up to 10 GHz (3 dB point) and have a reverse-bias leakage current between about 4 µA/mm and about 40 µA/mm. In some implementations, a multi-gate HEMTs having gate lengths of approximately 0.15 µm may drive currents up to 1 Amp/mm (RMS current value) at modulation rates up to 30 GHz (3 dB point) and have a reverse-bias leakage current between about 4 µA/mm and about 40 µA/mm. Single-gate devices may handle lower currents at similar or higher modulation rates. Gain values of the multi-gate HEMTs configured as an amplifier may be approximately 20 dB over their operating bandwidth.

In some embodiments, a multi-gate HEMT having individual gate lengths of approximately 0.5 µm may drive currents between about 0.5 Amp/mm and about 1 Amp/mm (RMS current value) at modulation rates up to 10 GHz (3 dB point) and have a reverse-bias leakage current between about 4 µA/mm and about 40 µA/mm. In some embodiments, a multi-gate HEMT having individual gate lengths of approximately 0.15 µm may drive currents between about 0.5 Amp/mm and about 1 Amp/mm at modulation rates up to 30 GHz (3 dB point) and have a reverse-bias leakage current between about 4 µA/mm and about 40 µA/mm. Gain values of the multi-gate HEMTs may be approximately 20 dB over their operating bandwidth and the multi-gate HEMTs may withstand reverse-bias voltages as high as 1500 V in some cases, and as high as 2000 V in some embodiments. Such HEMTs may be used in high-speed amplifiers of any suitable design, e.g., class A, class B, class AB, Doherty, etc.

Example fabrication techniques that may be used to form high-voltage HEMTs will now be described. FIG. 16A through FIG. 16G shows structures associated with one method of fabricating high-voltage HEMTs, in which source and drain contacts are formed before pattering the gate. FIG. 17A through FIG. 17J shows structures associated with another method of fabricating high-voltage HEMTs, in which source and drain contacts, a gate, and a gate connected field plate are deposited at a same time. The illustrations of FIG. 17A through FIG. 17J provide further details of resist patterning and lift-off steps, which may be used in the process illustrated in FIG. 16A through FIG. 16G. Methods of fabricating high-voltage HEMTs are not limited to only the structures and steps shown and described.

Figure 16A:
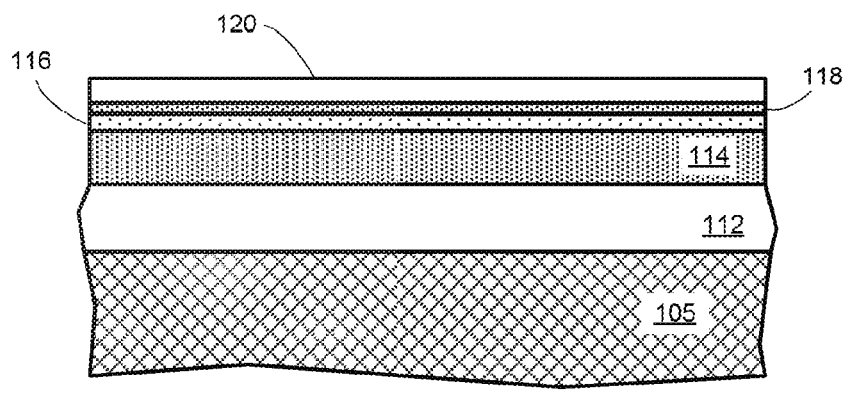
FIG. 16A illustrates a multi-layer substrate on which a high-voltage HEMT may be formed.

Referring to FIG. 16A, a wafer may be prepared or obtained that includes a multi-layer stack for a high-voltage HEMT. For example, the wafer may comprise a crystalline or semiconductor substrate 105, a buffer layer 112, a gallium-nitride conduction layer 114, and a barrier layer 116. The buffer layer 112, gallium-nitride conduction layer 114, and barrier layer 116 may be epitaxially grown on substrate or deposited by any suitable process. In some embodiments a wafer may include a semiconductor cap layer 118, which may be grown by epitaxy. According to some implementations, a first insulating layer 120 (for example, an oxide or silicon nitride layer) may be deposited over the multi-layer stack using any suitable deposition process. Any one or combination of deposition processes and any of the materials described above in connection with FIG. 1A may be used to form a wafer or substrate depicted in FIG. 16A.

Figure 16B:
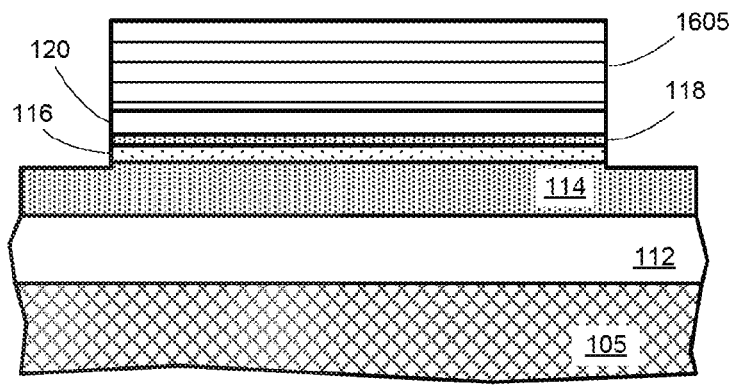
FIG. 16B, FIG. 16C and FIG. 16D depict structures associated with acts for forming source, drain, gate, and a gate-connected field plate, according to some embodiments.
Figure 16C:
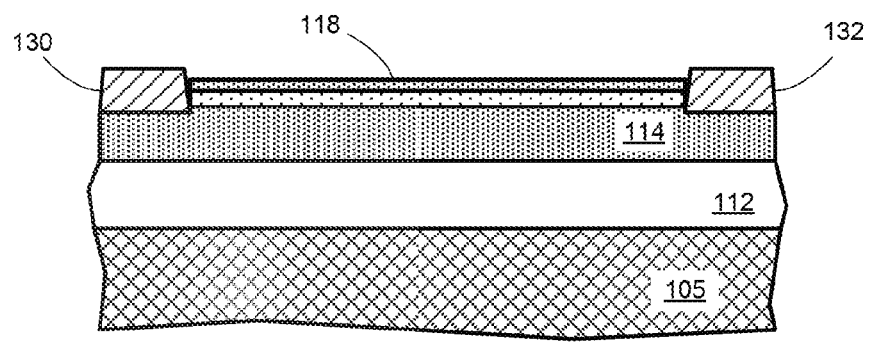
Figure 16D:
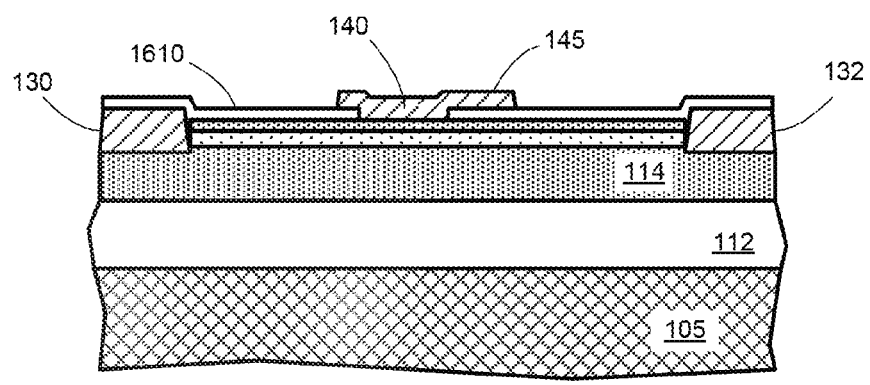

According to some embodiments, a photoresist 1605 may be applied and patterned over the insulating layer 120 to selectively etch vias in the photoresist for source and drain contacts, as depicted in FIG. 16B. Source and drain contacts 130, 132 may be deposited and the resist 1605 removed during a lift-off process, yielding the structure shown in FIG. 16C. In some implementations, the source and drain contacts may be alloyed to the conduction and/or barrier layer by subjecting the wafer to high temperatures (e.g., between 500° C. and 950° C.). The first insulating layer 120 may, or may not, be stripped from the wafer.

If the first insulating layer is removed, a second insulating layer 1610 (shown in FIG. 16D) may be deposited on the wafer, e.g., deposited using a conformal deposition process such as a chemical vapor deposition process. Other deposition processes may be used in other embodiments (e.g., sputtering or evaporation). The second insulating layer may be a silicon-nitride layer or any suitable gate insulator described in connection with FIG. 1A. A photoresist may be applied and patterned over the second insulating layer 1610 to open a gate via in the second insulating layer. The gate 140 and gate-connected field plate 145 may be formed in a single lift-off step, though separate depositions may be used for the gate and the gate-connected field plate in some cases. The gate, gate-connected field plate, and source and drain contacts may be any metal composition described in connection with FIG. 1A.

In an alternative process, the substrate may be subjected to a brief $O_2$ plasma treatment prior to deposition of the gate. The $O_2$ plasma treatment may form a thin oxide, e.g., a gallium oxide, between the gate 140 and cap layer 118, for example.

Figure 16E:
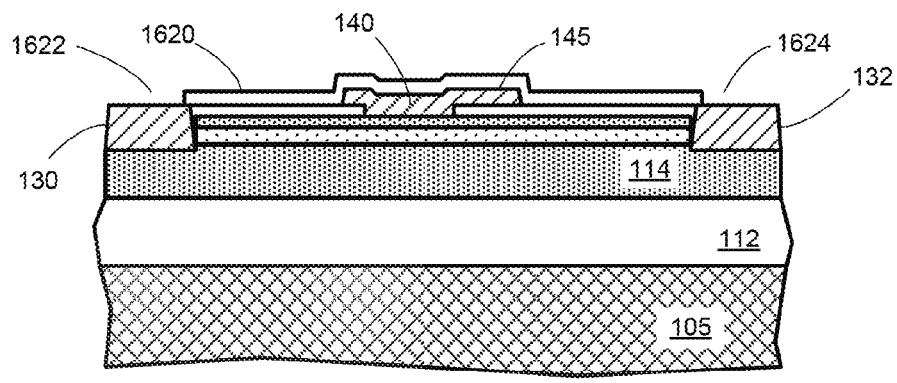
FIG. 16E, FIG. 16F and FIG. 16G depict structures associated with acts for forming a source-connected field plate, and additional source and drain metallizations, according to some embodiments.

A third insulating layer 1620 may be deposited over the gate and gate-connected field plate, as depicted in FIG. 16E. The third insulating layer 1620 may be a silicon-nitride layer, or any other suitable insulator, and may be deposited by any suitable process. A resist (not shown) may be applied and patterned over the third insulating layer 1620, so that source and drain vias 1622, 1624 may be opened through the third insulating layer 1620 to the source and drain contacts 130, 132. The source and drain vias may be opened using a selective etching process that etches the third insulating layer 1620, but negligibly etches the resist. The resist may be stripped from the wafer after opening source and drain vias.

Figure 16F:
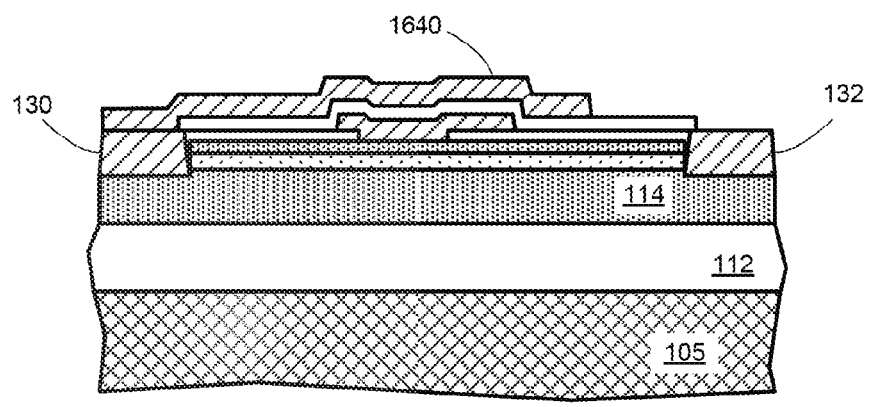
Figure 16G:
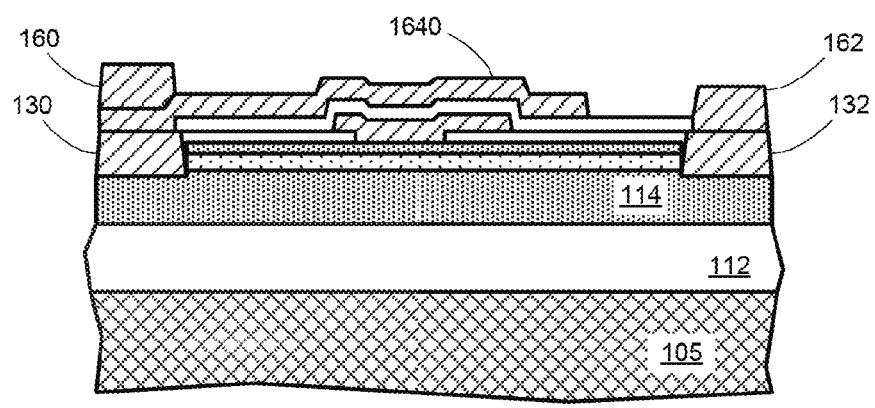

Subsequently, a resist (not shown) may be applied and patterned to open a region in the resist for a source-connected field plate that electrically connects to the source contact 130 and extends over the gate-connected field plate 145. The source-connected field plate 1640 may be formed using a lift-off step, and appear as shown in FIG. 16F. The source-connected field plate may be any metal composition described in connection with FIG. 1A. According to some embodiments, source and drain metallizations 160, 162 may be formed using an additional lift-off step.

Figure 17A:
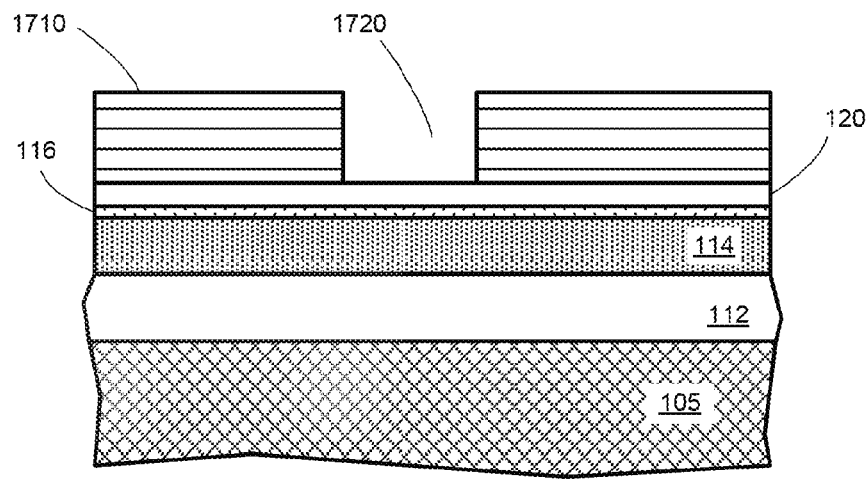
FIG. 17A, FIG. 17B and FIG. 17C depict structures associated with acts for forming gate, source, and drain vias in an insulating dielectric layer, according to some embodiments.

Alternative fabrication methods may be used to form high-voltage HEMTs, an example of which is depicted in FIG. 17A through FIG. 17J. According to some embodiments, a photoresist 1710 may be applied and patterned over the insulating layer 120, as depicted in FIG. 17A. The photoresist may be patterned to open a gate via 1720 by any suitable photolithography method, such as projection photolithography. Subsequently the insulating layer may be etched anisotropically (e.g., using reactive ion etching) to expose a portion of the barrier layer 116 (or cap layer 118 if present) for subsequent deposition of the gate.

According to some embodiments, an isotropic etch may be used to etch the insulating layer 120 when forming the gate via 1720. An isotropic etch may produce outward sloped sidewalls when etching through the insulating layer. These sloped sidewalls may then resulted in outward sloped gate walls when the gate is deposited over the insulating layer.

Figure 17B:
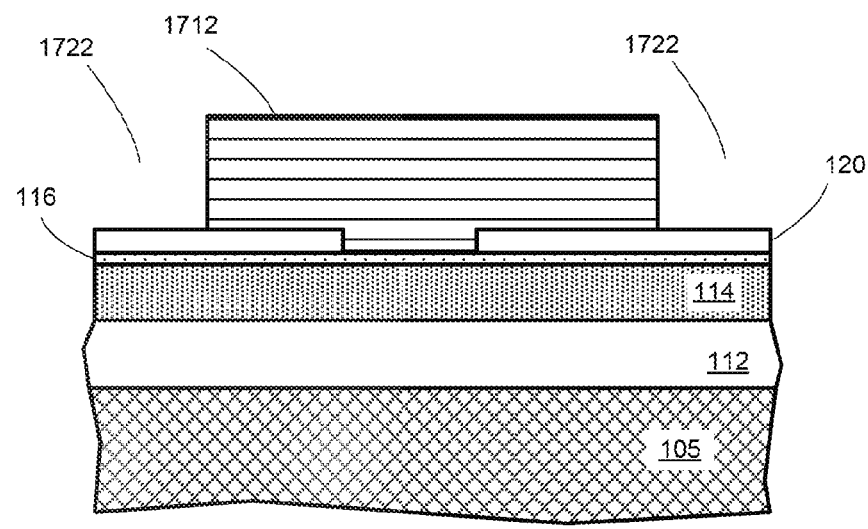
Figure 17C:
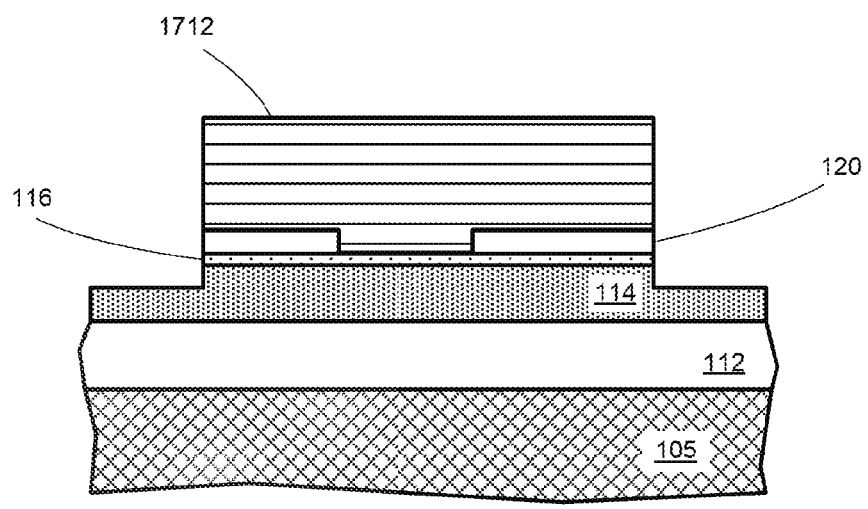

The first resist layer 1710 may be stripped from the substrate, and a second layer of resist 1712 may be applied and patterned to expose source and drain vias 1722, as depicted in FIG. 17B. The insulating layer 120 may then be etched anisotropically, as depicted in FIG. 17C to expose at least the barrier layer 116. In some embodiments, the etch may stop at or part way into the barrier layer. In some implementations, the etch may continue into the conduction layer 114, as depicted. The second resist layer 1720 may then be stripped from the substrate.

Figure 17D:
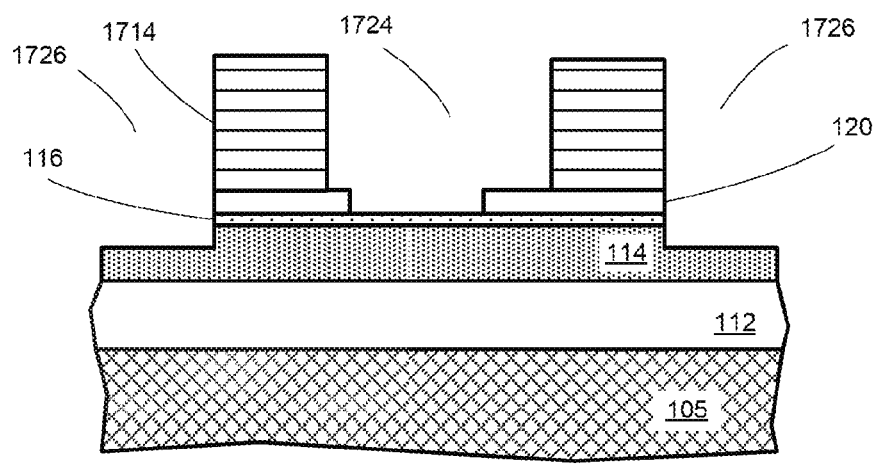
FIG. 17D, FIG. 17E and FIG. 17F depict structures associated with acts for forming a gate, source, drain, and gate-connected field plate, according to some embodiments.
Figure 17E:
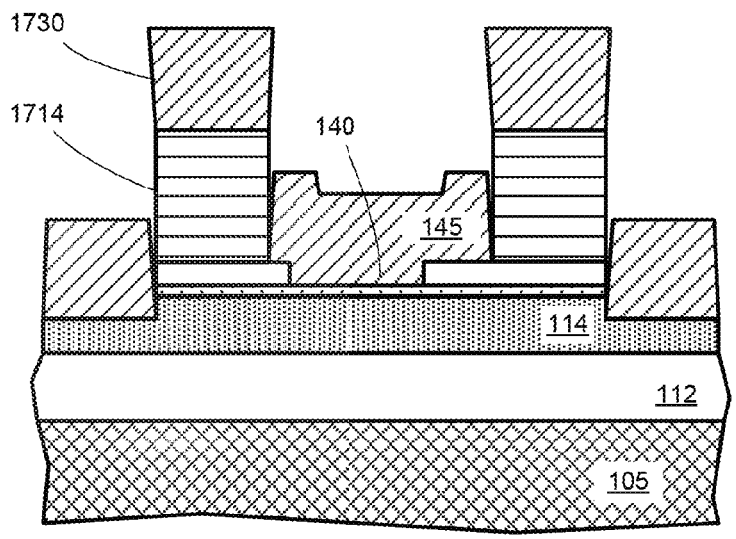

In some embodiments, a third resist layer 1714 may be pattered over the substrate to open up source and drain vias 1726 and a gate via 1724, as depicted in FIG. 17D. The gate via 1724 may be larger than the area opened in the insulating layer 120 from the previous gate via patterning step. A liftoff process may be carried out to deposit the gate, gate-connected field plate, source, and drain conductors in a single step, as illustrated in FIG. 17E. According to some embodiments, the deposition also forms a gate-connected field plate 145 that extends beyond the gate 140 over the insulating layer 120.

Figure 17F:
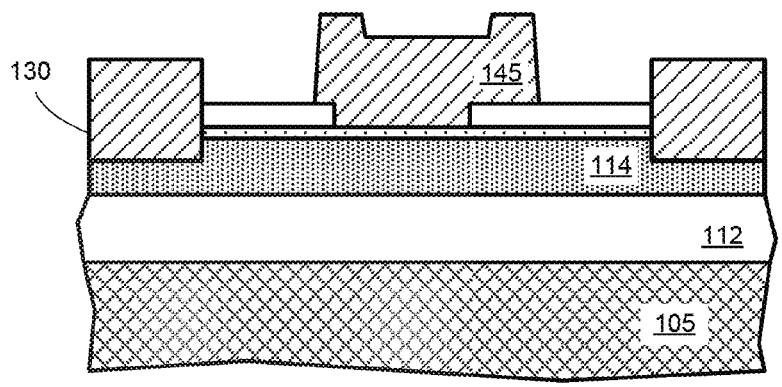

The remaining resist 1714 may be dissolved in a solvent bath, according to some embodiments, lifting off the overlying material 1730. The resulting structure may appear as shown in FIG. 17F. In some embodiments, the dissolution of the resist 1714 may involve ultrasonic agitation, spray, or other agitation to help remove the resist and overlying material.

Figure 17G:
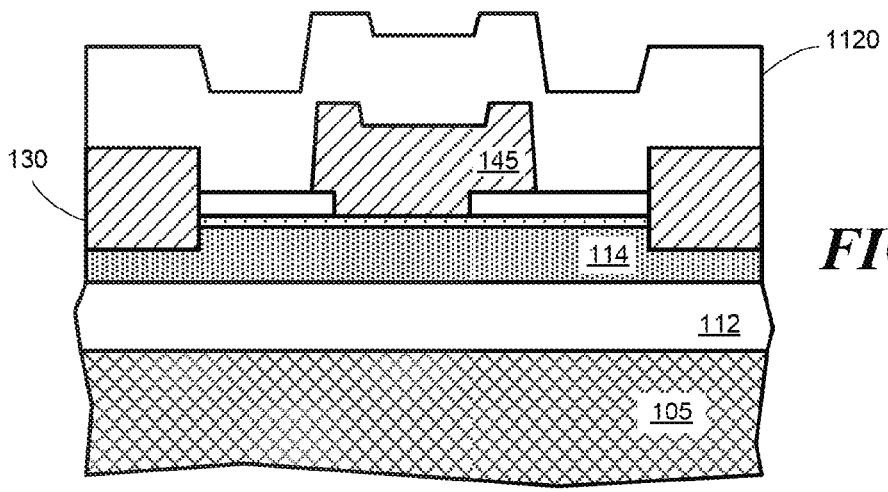
FIG. 17G depicts structure associated with deposition of a second insulating layer.
Figure 17H:
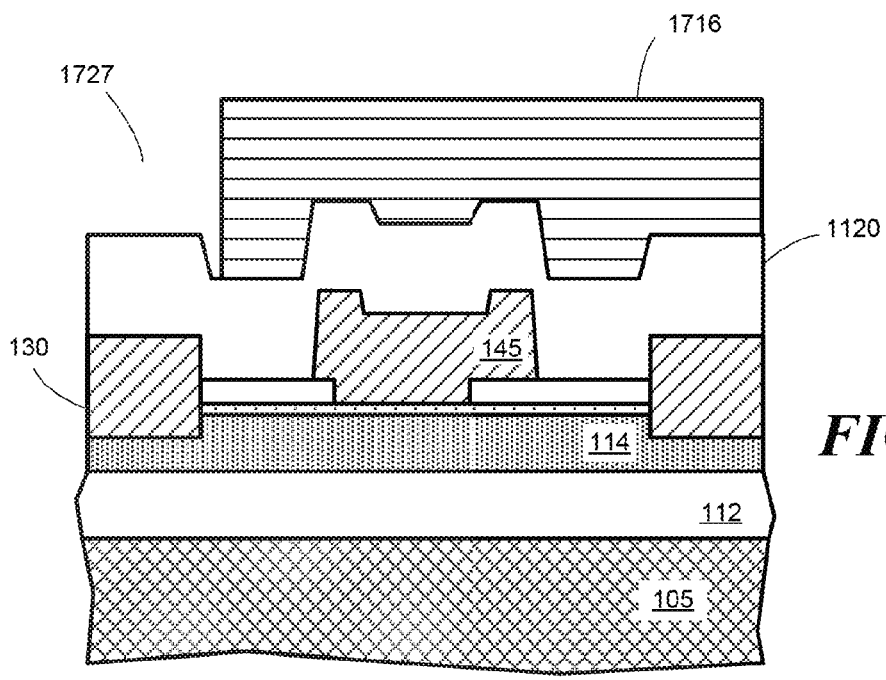
FIG. 17H and FIG. 17I depict structures associated with acts for opening a via in the second insulating layer to form a source-connected field plate, according to some embodiments.

Subsequently, a second insulating layer 1120 may be formed over the substrate, as depicted in FIG. 17G. The second insulating layer may be deposited by any suitable deposition process. The second insulating layer may be coated with a fourth photoresist layer 1716, and also patterned to open a via 1727 over the source 130, as depicted in FIG. 17H. The resist may serve as an etch mask so that the second insulating layer 1120 may be etched to open a via to the source conductor 130. Subsequently, the fourth photoresist layer 1716 may be stripped from the substrate.

Figure 17I:
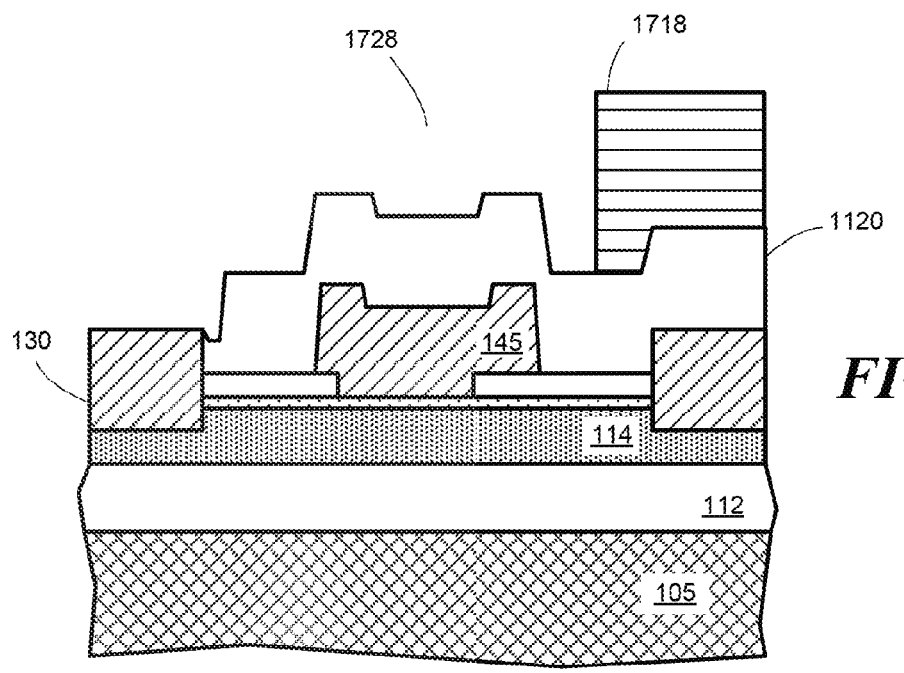
Figure 17J:
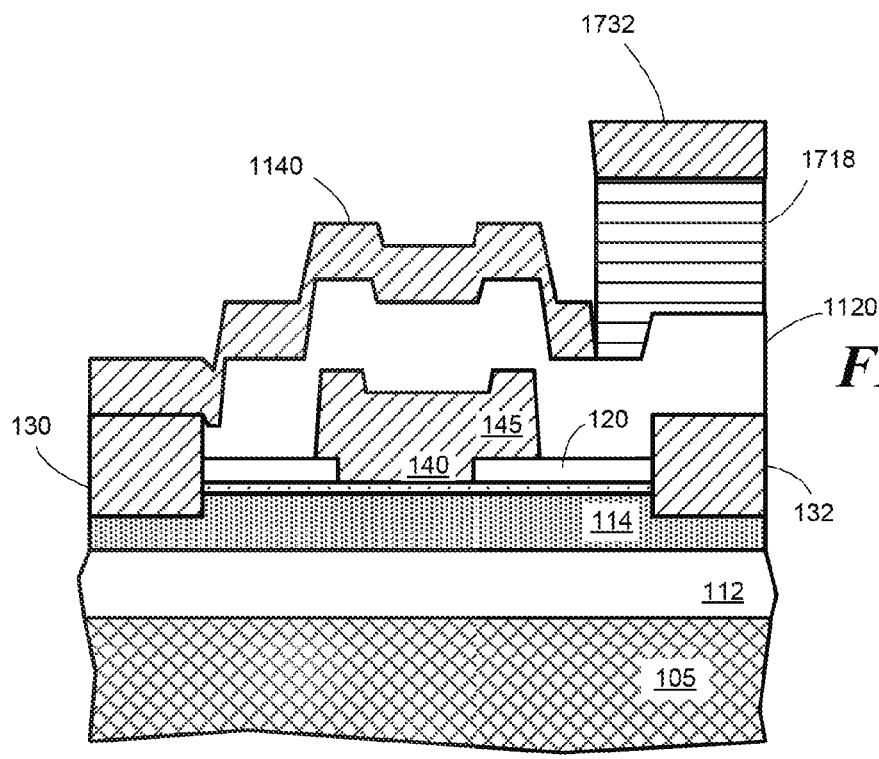
FIG. 17J illustrates deposition of a source-connected field plate, according to some embodiments.

A fifth photoresist layer 1718 may be deposited and patterned to open a source-connected field-plate via 1728, as depicted in FIG. 17I. A deposition process may be used to deposit conductive material for the source-connected field plate 1140, as depicted in FIG. 17J. Subsequently, a lift-off step may be performed to remove remaining resist 1718 and overlying material 1732, as described above in connection with FIG. 17F.

According to some embodiments, fabrication techniques for forming gate-connected and source-connected field plates may be performed without planarization of the substrate after depositions of the gate-connected field plate, insulating layers, and subsequent source-connected field plates. Avoiding planarization steps can reduce the time and cost of device fabrication. In some cases, planarization steps (e.g., chemical-mechanical polishing) may be used after some or all depositions of the gate-connected field plate, insulating layers, and source-connected field plate.

Embodiments include the following configurations of a high electron-mobility transistor.

(1) A high electron-mobility transistor (HEMT) comprising a gallium-nitride conduction layer; a barrier layer formed over the gallium-nitride conduction layer; a gate, source, and drain formed over the barrier layer; a first insulating layer formed in regions between the gate and drain and between the gate and source; a gallium-oxide layer formed between the barrier layer and the gate; and a gate-connected field plate electrically connected to the gate and extending beyond edges of the gate toward the drain and source over the first insulating layer.

(2) The HEMT of (1), wherein the gallium-oxide layer has a thickness between approximately 1 nm and approximately 5 nm.

(3) The HEMT of (2), further comprising a gallium-nitride cap layer formed between the barrier layer and the gallium-oxide layer.

(4) The HEMT of (3), wherein a thickness of the gallium-nitride cap layer is between approximately 1 nm and approximately 10 nm.

(5) The HEMT of (3), further comprising a source-connected field plate comprising a conductor that is electrically connected to the source and extends over the gate; and a second insulating layer separating the source-connected field plate and the gate.

(6) The HEMT of (5), wherein the source-connected field plate extends beyond the gate-connected field plate toward the drain a distance between approximately 1 micron and approximately 4 microns.

(7) The HEMT of (6), wherein an edge of the source-connected field plate is between approximately 4 microns and approximately 10 microns from an edge of the drain.

(8) The HEMT of (5), wherein a thickness of the first insulating layer is between approximately 25 nm and approximately 200 nm.

(9) The HEMT of (5), wherein a thickness of the second insulating layer is between approximately 300 nm and approximately 600 nm.

(10) The HEMT of (5) configured to withstand a reverse-bias voltage of approximately 2000 volts.

(11) The HEMT of (10), wherein a reverse-leakage current at 2000 volts reverse bias is not more than 40 microamps per millimeter of gate width.

(12) The HEMT of (10) configured to handle a forward current of 1 amp per millimeter of gate width.

(13) The HEMT of (3), further comprising electrical isolation regions formed adjacent to the source and drain, wherein the electrical isolation regions comprise damaged crystalline semiconductor that includes one or more of the following implanted ion species: nitrogen, phosphorous, boron, and argon.

(14) The HEMT of (3), wherein a length of the gate is between approximately 0.1 micron and approximately 1.5 micron.

(15) The HEMT of (14), wherein edges of the gate are sloped outward between approximately 5 degrees and approximately 60 degrees from vertical.

(16) The HEMT of (14), wherein the gate-connected field plate extends beyond a first edge of the gate toward the drain between approximately 0.3 μm and approximately 0.8 μm, and extends beyond a second edge of the gate toward the source between approximately 0.1 μm and approximately 0.4 μm.

(17) The HEMT of (3), wherein a spacing between an edge of the gate and an edge of the drain is between approximately 5 microns and approximately 20 microns.

(18) The HEMT of (3), wherein the gate length is approximately 0.15 micron, and the HEMT is configured to drive currents up to 1 amp/mm at modulation rates as high as 30 GHz.

(19) A high electron-mobility transistor (HEMT) comprising a gallium-nitride conduction layer; a barrier layer formed over the gallium-nitride conduction layer; a gate, source, and drain formed over the barrier layer; a first insulating layer formed in regions between the gate and drain and between the gate and source; a gate insulating layer having a thickness between approximately 1 nm and approximately 5 nm formed between the barrier layer and the gate; and a gate-connected field plate electrically connected to the gate and extending beyond edges of the gate toward the drain and source over the first insulating layer.

(20) The HEMT of (19), further comprising a source-connected field plate comprising a conductor that is electrically connected to the source and extends over the gate; and a second insulating layer separating the source-connected field plate and the gate.

(21) The HEMT of (20), wherein the source-connected field plate extends beyond the gate-connected field plate toward the drain a distance between approximately 1 micron and approximately 4 microns.

(22) The HEMT of (21), wherein an edge of the source-connected field plate is between approximately 4 microns and approximately 10 microns from an edge of the drain.

(23) The HEMT of (20), wherein a thickness of the first insulating layer is between approximately 25 nm and approximately 200 nm.

(24) The HEMT of (20), wherein a thickness of the second insulating layer is between approximately 300 nm and approximately 600 nm.

(25) The HEMT of (20) configured to withstand a reverse-bias voltage of approximately 2000 volts.

(26) The HEMT of (25), wherein a reverse-leakage current at 2000 volts reverse bias is not more than 40 microamps per millimeter of gate width.

(27) The HEMT of (25) configured to handle a forward current of 1 amp per millimeter of gate width.

(28) The HEMT of (19), wherein the gate insulating layer comprises gallium-oxide.

Embodiments include the following configurations of methods for making a high electron-mobility transistor.

(29) A method for making a high electron-mobility transistor (HEMT), the method comprising forming a gallium-nitride conduction layer on a substrate; forming a barrier layer adjacent to the gallium-nitride conduction layer; forming a first source and a drain spaced apart and in electrical contact with the conduction layer; forming a gate adjacent to the barrier layer between the source and the drain; and forming a gallium-oxide layer between the gate and the barrier layer.

(30) The method of (29), wherein forming the gallium-oxide layer comprises opening a via to expose a region of a gallium-nitride layer at the location of the gate prior to forming the gate; and subjecting the exposed region to an oxygen plasma for a period of time.

(31) The method of (30), wherein the period of time is between approximately 10 seconds and approximately 120 seconds.

(32) The method of (30), further comprising maintaining a pressure between approximately 0.5 Torr and approximately 3 Torr while subjecting the exposed region to the oxygen plasma.

(33) The method of (30, further comprising forming a gallium-nitride cap layer between the barrier layer and the source and drain, wherein the gallium-oxide layer is formed from the gallium-nitride cap layer.

(34) The method of (30), further comprising forming a first insulating layer that extends between the source and gate and the gate and drain; and forming a gate-connected field plate in electrical contact with the gate that extends beyond outer edges of the gate toward the source and drain.

(35) The method of (34), further comprising forming a second insulating layer that extends over the gate and gate-connected field plate; and forming a source-connected field plate in electrical contact with the source that extends beyond the gate toward the drain.

(36) The method of (30), further comprising implanting ions into the conduction layer to damage the conduction layer and form electrical isolation regions adjacent to the source and the drain.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A high electron-mobility transistor (HEMT) comprising:
   a gallium-nitride conduction layer;
   a barrier layer formed over the gallium-nitride conduction layer;
   a gate, source, and drain formed over the barrier layer;
   a first insulating layer formed in regions between the gate and drain and between the gate and source;
   a gallium-oxide layer formed between the barrier layer and the gate; and
   a gate-connected field plate electrically connected to the gate and extending beyond edges of the gate toward the drain and source over the first insulating layer.

2. The HEMT of claim 1, wherein the gallium-oxide layer has a thickness between approximately 1 nm and approximately 5 nm.

3. The HEMT of claim 2, further comprising a gallium-nitride cap layer formed between the barrier layer and the gallium-oxide layer.

4. The HEMT of claim 3, wherein a thickness of the gallium-nitride cap layer is between approximately 1 nm and approximately 10 nm.

5. The HEMT of claim 3, further comprising:
   a source-connected field plate comprising a conductor that is electrically connected to the source and extends over the gate; and
   a second insulating layer separating the source-connected field plate and the gate.

6. The HEMT of claim 5, wherein the source-connected field plate extends beyond the gate-connected field plate toward the drain a distance between approximately 1 micron and approximately 4 microns.

7. The HEMT of claim 6, wherein an edge of the source-connected field plate is between approximately 4 microns and approximately 10 microns from an edge of the drain.

8. The HEMT of claim 5, wherein a thickness of the first insulating layer is between approximately 25 nm and approximately 200 nm.

9. The HEMT of claim 5, wherein a thickness of the second insulating layer is between approximately 300 nm and approximately 600 nm.

10. The HEMT of claim 5 configured to withstand a reverse-bias voltage of approximately 2000 volts.

11. The HEMT of claim 10, wherein a reverse-leakage current at 2000 volts reverse bias is not more than 40 microamps per millimeter of gate width.

12. The HEMT of claim 10 configured to handle a forward current of 1 amp per millimeter of gate width.

13. The HEMT of claim 3, further comprising electrical isolation regions formed adjacent to the source and drain, wherein the electrical isolation regions comprise damaged crystalline semiconductor that includes one or more of the following implanted ion species: nitrogen, phosphorous, boron, and argon.

14. The HEMT of claim 3, wherein a length of the gate is between approximately 0.1 micron and approximately 1.5 micron.

15. The HEMT of claim 3, wherein a spacing between an edge of the gate and an edge of the drain is between approximately 5 microns and approximately 20 microns.

16. The HEMT of claim 3, wherein the gate length is approximately 0.15 micron, and the HEMT is configured to drive currents up to 1 amp/mm at modulation rates as high as 30 GHz.

17. A high electron-mobility transistor (HEMT) comprising:
- a gallium-nitride conduction layer;
- a barrier layer formed over the gallium-nitride conduction layer;
- a gate, source, and drain formed over the barrier layer;
- a first insulating layer formed in regions between the gate and drain and between the gate and source;
- a gate insulating layer having a thickness between approximately 1 nm and approximately 5 nm formed between the barrier layer and the gate; and
- a gate-connected field plate electrically connected to the gate and extending beyond edges of the gate toward the drain and source over the first insulating layer.

18. The HEMT of claim 17, further comprising:
- a source-connected field plate comprising a conductor that is electrically connected to the source and extends over the gate; and
- a second insulating layer separating the source-connected field plate and the gate.

19. The HEMT of claim 18, wherein the source-connected field plate extends beyond the gate-connected field plate toward the drain a distance between approximately 1 micron and approximately 4 microns.

20. The HEMT of claim 19, wherein an edge of the source-connected field plate is between approximately 4 microns and approximately 10 microns from an edge of the drain.

21. The HEMT of claim 18, wherein a thickness of the first insulating layer is between approximately 25 nm and approximately 200 nm.

22. The HEMT of claim 18, wherein a thickness of the second insulating layer is between approximately 300 nm and approximately 600 nm.

23. The HEMT of claim 18 configured to withstand a reverse-bias voltage of approximately 2000 volts.

24. The HEMT of claim 23, wherein a reverse-leakage current at 2000 volts reverse bias is not more than 40 microamps per millimeter of gate width.

25. The HEMT of claim 23 configured to handle a forward current of 1 amp per millimeter of gate width.

26. The HEMT of claim 17, wherein the gate insulating layer comprises gallium-oxide.

* * * * *